(12) United States Patent
Morii et al.

(10) Patent No.: US 7,126,158 B2
(45) Date of Patent: Oct. 24, 2006

(54) IMAGE PICKUP APPARATUS, RADIATION IMAGE PICKUP APPARATUS AND RADIATION IMAGE PICKUP SYSTEM

(75) Inventors: Toshiko Morii, Kanagawa (JP); Masakazu Morishita, Kanagawa (JP); Minoru Watanabe, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/294,519

(22) Filed: Dec. 6, 2005

(65) Prior Publication Data

US 2006/0091390 A1    May 4, 2006

Related U.S. Application Data

(62) Division of application No. 10/705,860, filed on Nov. 13, 2003, now Pat. No. 6,898,540.

(51) Int. Cl.
    *H01L 29/04*    (2006.01)
(52) U.S. Cl. .................. 257/59; 257/291; 257/293
(58) Field of Classification Search ............. 257/59, 257/291, 293
    See application file for complete search history.

(56) References Cited

U.S. PATENT DOCUMENTS

| | | | | |
|---|---|---|---|---|
| 4,644,404 | A | 2/1987 | Tabei | 348/304 |
| 5,498,880 | A | 3/1996 | Lee et al. | 250/580 |
| 5,619,033 | A | 4/1997 | Weisfield | 280/208.1 |
| 5,793,047 | A | 8/1998 | Kobayashi et al. | 250/370.09 |
| 5,801,385 | A | 9/1998 | Endo et al. | 250/370.11 |
| 5,965,872 | A | 10/1999 | Endo et al. | 250/208.1 |
| 6,118,851 | A | 9/2000 | Endo et al. | 378/98.8 |
| 6,163,386 | A | 12/2000 | Kobayashi et al. | 358/482 |
| 6,236,579 | B1 | 5/2001 | Watanabe et al. | 363/25 |
| 6,332,016 | B1 | 12/2001 | Kobayashi | 378/98.2 |
| 6,489,618 | B1 | 12/2002 | Morishita | 250/370.09 |
| 6,528,796 | B1 | 3/2003 | Kaifu et al. | 250/370.11 |
| 6,906,332 | B1 | 6/2005 | Tashiro et al. | 250/370.11 |
| 2001/0038075 | A1 | 11/2001 | Morishita | 250/370.08 |
| 2002/0017666 | A1 | 2/2002 | Ishii et al. | 257/291 |
| 2002/0066861 | A1 | 6/2002 | Morishita | 250/370.09 |
| 2002/0079493 | A1 | 6/2002 | Morishita | 257/72 |
| 2002/0190215 | A1 | 12/2002 | Tashiro et al. | 250/370.11 |
| 2003/0010899 | A1 | 1/2003 | Ishii et al. | 250/214.1 |
| 2003/0155517 | A1 | 8/2003 | Numai et al. | 250/370.09 |
| 2003/0226974 | A1 | 12/2003 | Nomura et al. | 250/370.11 |

*Primary Examiner*—Long Pham
(74) *Attorney, Agent, or Firm*—Fitzpatrick, Cella, Harper & Scinto

(57) ABSTRACT

An image pickup apparatus or a radiation image pickup apparatus according to the present invention includes: a plurality of pixels which are two-dimensionally arranged on a substrate, each of the plurality of pixels including a set of a semiconductor conversion element that converts an incident electromagnetic wave into an electrical signal and a switching element connected with the semiconductor conversion element; a drive wiring which is commonly connected with the plurality of switching elements arranged in a direction; and a signal wiring which is commonly connected with the plurality of switching elements arranged in a direction different from the direction, the switching element including a first semiconductor layer, the semiconductor conversion element being formed after the switching elements are formed and including the second semiconductor layer formed after the first semiconductor layer is formed, in which the semiconductor conversion element has an electrode formed outside a region in which two of the drive wiring, an electrode of the switching element, and the signal wiring overlap each other, exclusive of at least part of a region above the drive wiring and at least part of a region above the electrode of the switching element.

14 Claims, 24 Drawing Sheets

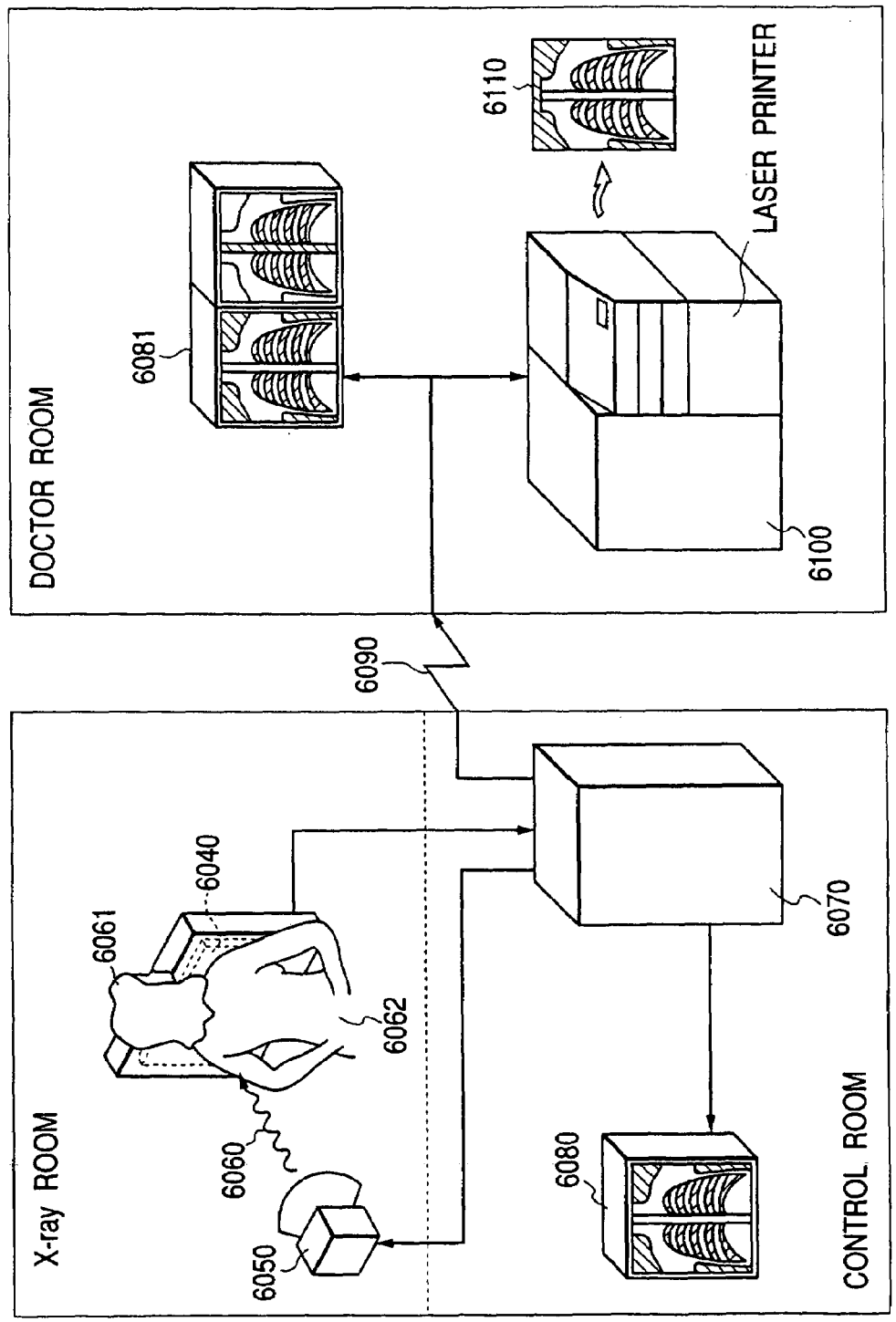

ially, according to the structure described in U.S. Pat.
IMAGE PICKUP APPARATUS, RADIATION IMAGE PICKUP APPARATUS AND RADIATION IMAGE PICKUP SYSTEM This application is a divisional of application Ser. No. 10/705,860, filed Nov. 13, 2003, now U.S. Pat. No. 6,898,540, the contents of which are incorporated by reference herein.

BACKGROUND OF THE INVENTION

1. Field of the Invention

The present invention relates to an image pickup apparatus and a radiation image pickup apparatus which are used for a medical X-ray camera, an analyzing apparatus, a nondestructive testing apparatus, and the like.

2. Related Background Art

In recent years, in the medical X-ray camera, an image pickup system using a film is rapidly shifting to a digital image pickup system. The digital image pickup system enables image processing, so that diagnostic accuracy can be improved. In addition, because it is unnecessary to develop a film, an image taking interval can be shortened, with the result that image taking can be efficiently conducted on a group medical examination or the like.

An image pickup apparatus of the digital image pickup system includes an indirect system in which a radiation such as an X-ray is frequency-converted into light (for example, visible light) and the light is converted into an electrical signal such as a charge and a direct system in which a radiation is directly converted into an electrical signal such as a charge. In the indirect system, a wavelength converting layer (for example, a phosphor layer) that converts the radiation into the visible light, a photoelectric conversion element, and a thin film transistor (TFT) constitute a set and a plurality of such sets compose the image pickup apparatus. In addition, the direct system, a radiation image pickup apparatus and a TFT becomes a set and a plurality of such sets compose the image pickup apparatus.

For example, a structure in which a TFT including a first semiconductor layer is formed on a substrate and a semiconductor conversion element including a second semiconductor layer is formed thereon is described in U.S. Pat. Nos. 5,498,880 B and 5,619,033 B.

Up to now, in order to obtain a size and a resolution which are equal to those of a film, a radiation image pickup apparatus in which several millions of pixels each measuring several hundreds of microns in square in size are arranged on a substrate and which has a high definition and a large size of several tens of centimeter square is used for such a medical X-ray camera of the digital image pickup system.

In steps of manufacturing the image pickup apparatus, a defect such as a wiring short circuit or a disconnection, resulting from the presence of a particle or a process trouble is caused with some probability. Therefore, in addition to a production step control and a process development which are conducted for reducing a defect to be caused, the image pickup apparatus is manufactured using a repair technique for repairing a defect portion.

For example, a repair technique in which a defect pixel is irradiated with laser light to melt a metal and a semiconductor layer, thereby electrically cutting the defect pixel is disclosed in U.S. Pat. No. 6,332,016 B. Various cut portions such as a TFT region, a TFT drive wiring, a source or drain electrode, a signal wiring, or a bias wiring are considered according to a type of each defect. Note that, coordinate data of the electrically cut pixel is stored in a system of the digital X-ray camera and image processing for data interpolation is generally conducted using surrounding pixel data.

In general, according to the repair technique using the laser light, if a plurality of metallic films are located in a laser irradiation region, those metallic films are short-circuited in melting in some conditions. Therefore, there is the case where the defect portion is difficult to repair. In particular, according to the structure described in U.S. Pat. No. 5,498,880 B or U.S. Pat. No. 5,619,033 B, a lower electrode of a light detection element is located above the TFT region to be repaired. Therefore, if the repair is conducted, the electrodes or the wirings that compose the TFT and the lower electrode of the light detection element are short-circuited, so that it is difficult to electrically separate the defect portion from a pixel portion.

Also, if the metallic film or the semiconductor layer of a thick film having a high resistance is located above the wiring to be cut, there is a fear that a problem is caused in that cut processing precision is reduced or cutting cannot be performed in some cases.

As described above, in the case where the semiconductor layer of a switching element is different from the semiconductor layer of the semiconductor conversion element, it is required to make more extensive studies on a structure used for suitable repair.

SUMMARY OF THE INVENTION

The present invention has been made in view of the above-mentioned conventional circumstances. An object of the present invention is to provide an image pickup apparatus, a radiation image pickup apparatus and a radiation image pickup system, in which it is possible to stably process a defect portion by laser repair even if a defect is caused, so that a manufacturing yield is improved.

In order to solve the above-mentioned problems, in an image pickup apparatus or a radiation image pickup apparatus which includes a switching element having a first semiconductor layer and a semiconductor conversion element which is located in an upper layer of the switching element and has a second semiconductor layer different from the first semiconductor layer, it is effective that an electrode of the semiconductor conversion element is formed outside a region in which a drive wiring of the switching element, electrodes of the switching element, and a signal wiring are not overlapped with one another, thereby forming an opening.

Therefore, according to the present invention, there is provided an image pickup apparatus or a radiation image pickup apparatus, including: a plurality of pixels which are two-dimensionally arranged on a substrate, each of the plurality of pixels including a set of a semiconductor conversion element that converts an incident electromagnetic wave into an electrical signal and a switching element connected with the semiconductor conversion element; a drive wiring which is commonly connected with the plurality of switching elements arranged in a direction; and a signal wiring which is commonly connected with the plurality of switching elements arranged in a direction different from the direction, the switching element including a first semiconductor layer, the semiconductor conversion element being formed after the switching elements are formed and including the second semiconductor layer formed after the first semiconductor layer is formed, in which the semiconductor conversion element has an electrode formed outside a region in which two of the drive wiring, an electrode of the switching element, and the signal wiring overlap each other, exclusive of at least part of a region above the drive wiring and at least part of a region above the electrode of the switching element.

Also, according to the present invention, there is provided an image pickup apparatus, including: a plurality of pixels which are two-dimensionally arranged on a substrate, each of the plurality of pixels including a set of a semiconductor conversion element that converts an incident electromagnetic wave into an electrical signal and a switching element connected with the semiconductor conversion element; a drive wiring which is commonly connected with the plurality of switching elements arranged in a direction; and a signal wiring which is commonly connected with the plurality of switching elements arranged in a direction different from the direction, the switching element including a first semiconductor layer, the semiconductor conversion element being formed above the switching element and including a second semiconductor layer different from the first semiconductor layer, in which the semiconductor conversion element has an opening formed outside a region in which two of the drive wiring, an electrode of the switching element, and the signal wiring overlap each other and in at least part of a region above the drive wiring and at least part of region above the electrode of the switching element.

According to the present invention, it is possible to stably process the defect portion by laser repair, so that the manufacturing yield is improved.

According to the present invention, the electromagnetic wave includes an electromagnetic wave of a wavelength region of from light such as visible light or infrared light to a radiation such as an X-ray, an α-ray, a β-ray, or a γ-ray.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 24 shows an application of a radiation image pickup apparatus according to the present invention to an X-ray diagnostic system.

DETAILED DESCRIPTION OF THE PREFERRED EMBODIMENTS

First Embodiment

In this embodiment, description will be made with reference to FIGS. 1 to 4 of an example of an image pickup apparatus using pixels, each of which includes a switching element composed of a TFT 1 and a semiconductor conversion element (photoelectric conversion element) 4 which is formed in the upper layer of the switching element 1 and composed of a PIN type photo diode.

Figure 1:
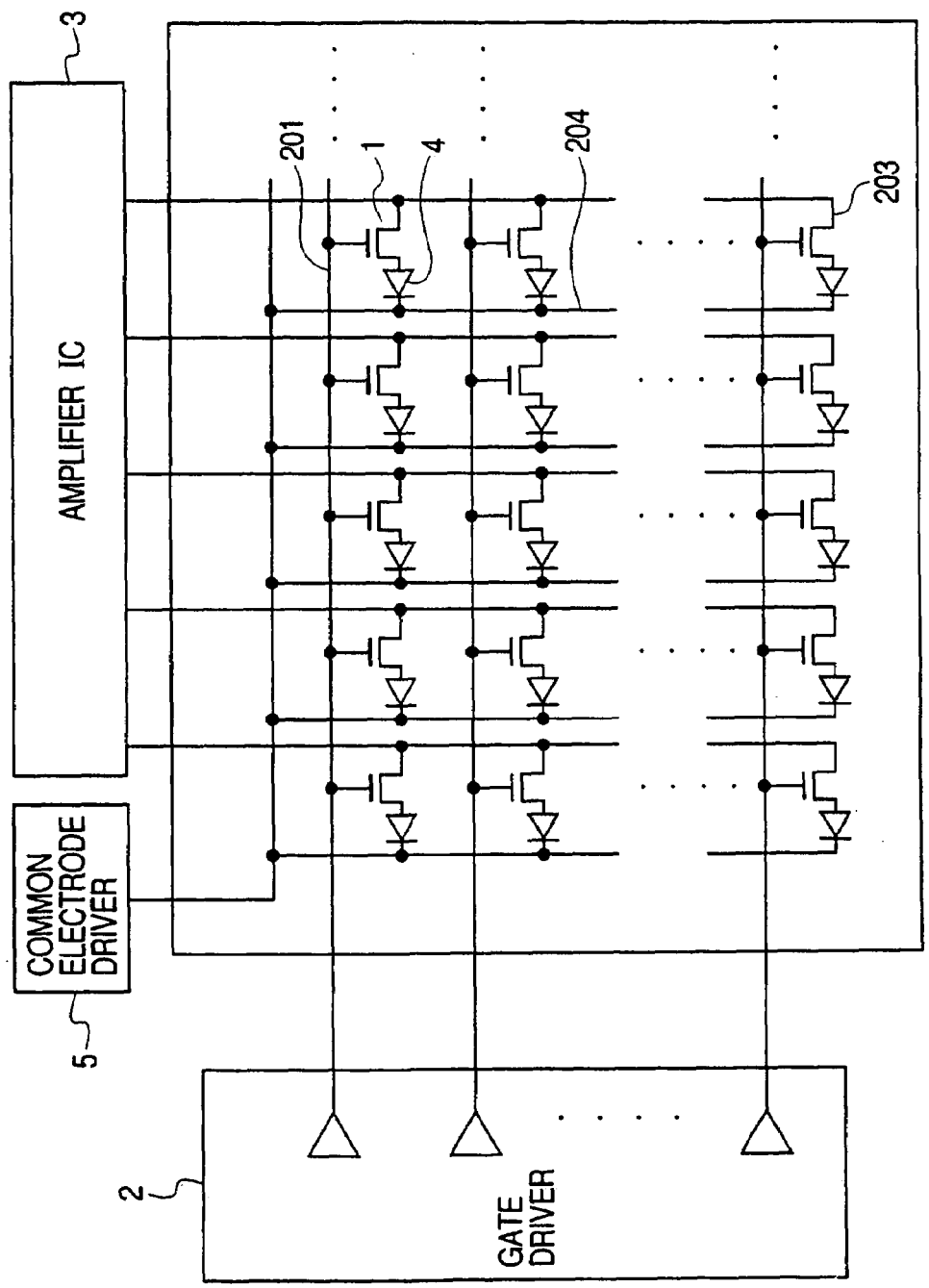
FIG. 1 is a schematic equivalent circuit diagram of an image pickup apparatus according to a first embodiment of the present invention.

FIG. 1 is a schematic equivalent circuit diagram according to this embodiment.

In FIG. 1, drive wirings (TFT drive wirings) 201 common to the TFTs 1 are connected with a gate driver 2 that controls turning on/off of each of the TFTs 1. The source or drain electrode of each of the TFTs 1 is connected with one of common signal wirings 203. The signal wirings 203 are connected with an amplifier IC 3. Bias wirings 204 for driving the semiconductor conversion element 4 of the PIN type are connected with a common electrode driver 5.

Figure 2:
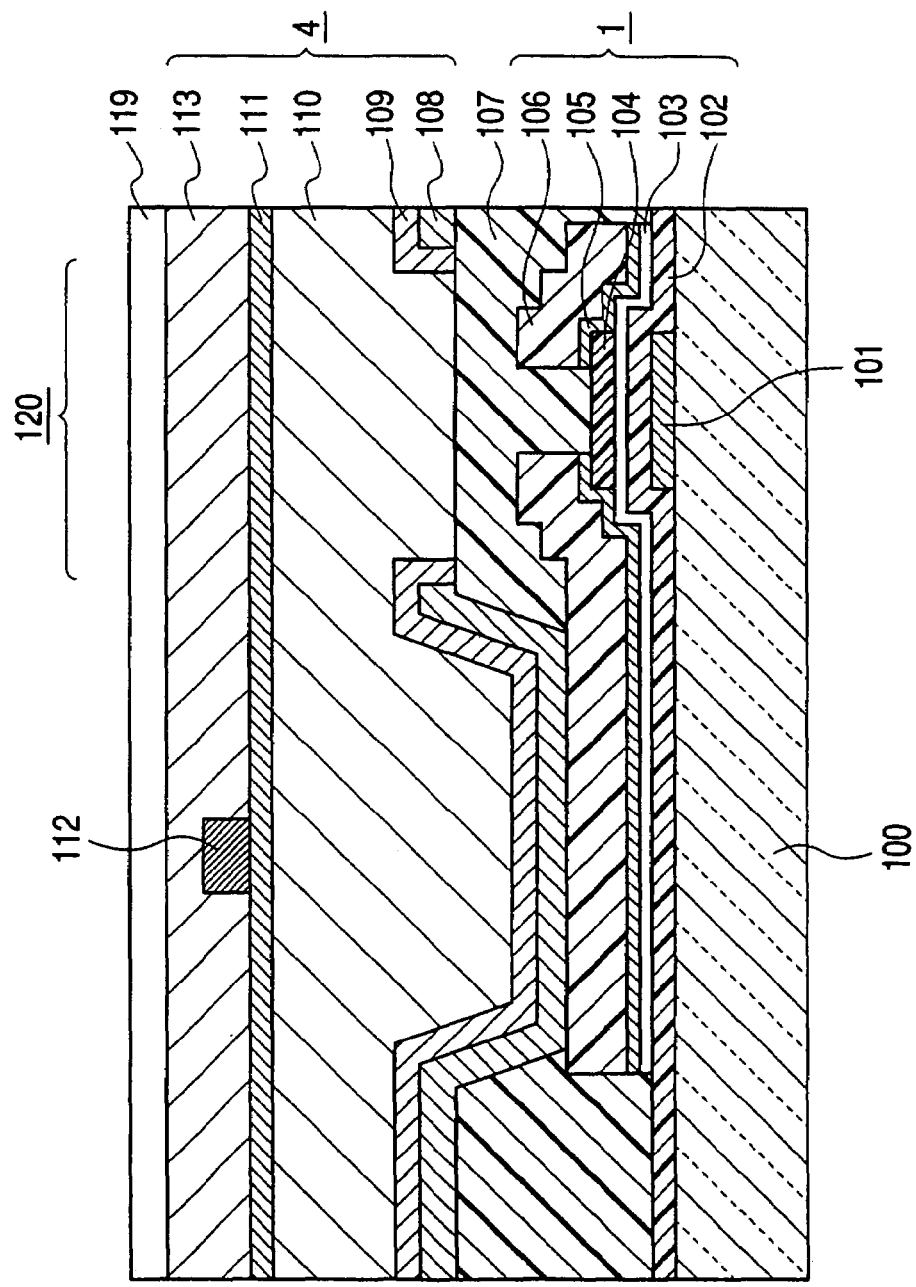
FIG. 2 is a schematic sectional view of the image pickup apparatus according to the first embodiment of the present invention.
Figure 3:
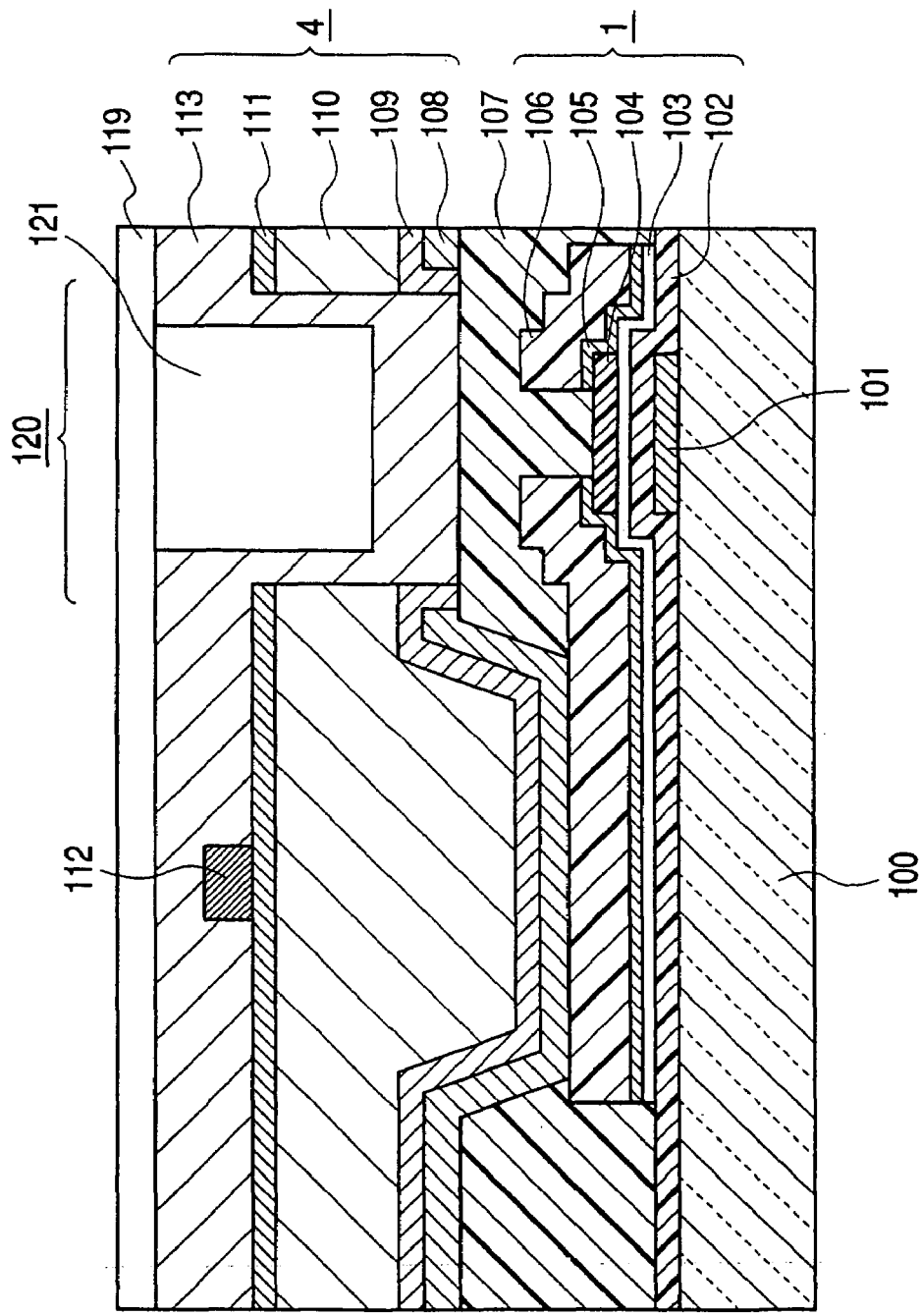
FIG. 3 is a schematic sectional view of the image pickup apparatus according to the first embodiment of the present invention.

FIGS. 2 and 3 are schematic sectional views according to this embodiment.

In FIG. 2, a metallic film 108 and an n-type semiconductor layer 109 which are located in a region corresponding to the TFT 1 are removed to form an opening 120. In FIG. 3, a second semiconductor layer 110 and a p-type semiconductor layer 111 which are located in the region corresponding to the TFT 1 are removed to form an opening 120.

Referring to FIGS. 2 and 3, examples of a layer structure of the image pickup apparatus according to this embodiment will be described.

First, a first conductive layer 101 (for example, AlNd/Mo, 2500 angstroms) is formed on a glass substrate 100 by sputtering and then patterning is conducted thereto to form the TFT drive wiring 201 (with a protruded portion serving as a gate electrode). Next, a first insulating layer 102 (for example, SiN, 3000 angstroms), a first semiconductor layer 103 (for example, a-Si, 500 angstroms), and a second insulating layer (channel protective layer) 104 (for example, SiN, 2000 angstroms) are formed in succession in the stated order on the glass substrate 100 and the TFT drive wiring by a CVD method. After that, using a resist image (not shown) formed by rear exposure and mask exposure, the second insulating layer 104 is etched so as to be left only on the channel of the TFT and above the TFT drive wiring.

Here, in order to improve the transfer capability of the TFT by reducing a parasitic capacitance produced due to overlap of a signal wiring side electrode with the TFT drive wiring in a TFT portion, it is preferable to form an etching stopper type TFT using the rear exposure.

Subsequently, an ohmic contact layer 105 (for example, n$^+$-type a-Si, 200 angstroms) is formed by a CVD method and a second conductive layer 106 (for example, AlNd/Mo, 4000 angstroms) is formed on the ohmic contact layer by sputtering. Next, the second conductive layer 106 is patterned by wet etching to form the source and drain electrodes and the signal wiring of the TFT. After that, the source-drain separation of the ohmic contact layer 105 and the element separation of the first semiconductor layer 103 are conducted by dry etching.

Next, a third insulating layer 107 (for example, an organic film of benzocyclobutene (BCB) or polyimide (PI)) is deposited as a planarizing film and a contact hole is formed on the electrode of the TFT. Then, a third conductive layer 108 (for example, AlNd/Mo, 2000 angstroms) is formed by sputtering to be connected with the TFT through the contact hole and to compose the lower electrode (pixel electrode) of the photo diode. The drain electrode of the TFT is formed up to the lower electrode of the photo diode and connected therewith through a contact hole.

The lower electrode of the photo diode is formed outside the region where at least two of the TFT drive wiring (with the protruded portion serving as the gate electrode), the source and drain electrodes of the TFT, and the signal wiring overlap each other, exclusive of at least part of the region above the TFT drive wiring (including the gate electrode) and at least part of the region above the source and drain electrodes of the TFT. Here, the lower electrode of the photo diode in the overlap portion (cross portion) of the signal wiring, the TFT constituting portion, the TFT drive wiring, and the signal wiring, and its vicinities is removed. In its vicinities, at least the drive wiring and the source and drain electrodes of the TFT extend. The drive wiring and the source and drain electrodes of the TFT can be cut with the laser irradiation. Note that the lower electrode of the photo diode may remain in the overlap portion between the TFT drive wiring and the signal wiring and the overlap portion between the gate electrode of the TFT and the source and drain electrodes thereof. In short, the lower electrode of the photo diode has only to be removed to such an extent as to enable the repair described below.

After that, in the case where only the first n-type semiconductor layer 109 is separated between pixels as shown in FIG. 2, the first n-type semiconductor layer 109 (for example, n$^+$-type a-Si, 1000 angstroms) is formed and then separated between pixels. Subsequently, two layers, that is, the second semiconductor layer 110 (for example, i-type a-Si, 5000 angstroms) and the first p-type semiconductor layer 111 (for example, p-type a-Si, 1000 angstroms) are formed in succession in the stated order by a CVD method. Then, a fourth conductive layer 112 (for example, Mo/Al/Mo, 4000 angstroms) is formed by sputtering to form the bias wiring of the photo diode.

If the second semiconductor layer 110 located above the TFT region is thinned by half etching after the pixel separation of the p-type semiconductor layer 111, the processability in the case of using the laser repair becomes stable, which is further favorable. Subsequently, a protective layer 113 (for example, SiN and an organic film) is formed, electrical testing is conducted, and the laser repair is conducted on a defect portion if necessary. After that, in this embodiment, the phosphor layer 119 as the wavelength converting layer is formed in the radiation incident surface. As the phosphor layer 119, the phosphor layer formed of Gd$_2$O$_2$S, CsI, etc. for converting the radiation such as the X-ray to the visible light is formed. Here, the phosphor layer 119 is directly formed on the protective layer 113, but may be formed on the sheet to bond the sheet onto the protective layer 113 through the adhesive layer.

Also, as shown in FIG. 3, it is possible to conduct the pixel separation on not only the n-type semiconductor layer 109 but also on the second semiconductor layer 110 and the p-type semiconductor layer 111. Even in this case, the lower electrode of the photo diode is formed outside a region in which two of the TFT drive wiring (with the protruded portion serving as the gate electrode), the source and drain electrodes of the TFT, and the signal wiring overlap each other, exclusive of at least part of the region above the TFT drive wiring (including the gate electrode) and at least part of the region above the source and drain electrodes of the TFT. Then, the n-type semiconductor layer 109 (for example, n-type a-Si, 1000 angstroms), the second semiconductor layer 110 (for example, i-type a-Si, 5000 angstroms), and the p-type semiconductor layer 111 (for example, p-type a-Si, 1000 angstroms) are formed in succession by a CVD method. Further, the fourth conductive layer 112 (for example, Mo/Al/Mo, 4000 angstroms) is formed by sputtering to form the bias wiring of the photo diode. Then, with respect to the photo diode which is composed of the p-type semiconductor layer 111, the i-type semiconductor layer 110, and the n-type semiconductor layer 109, upper films are removed in at least part of the region above the TFT drive wiring (including the gate electrode) and at least part of the region above the source and drain electrodes of the TFT outside a region in which two of the TFT drive wiring (with the protruded portion serving as the gate electrode), the source and drain electrodes of the TFT, and the signal wiring overlap each other, by dry etching to form an opening. In the structure of FIG.

3, when the phosphor layer is directly formed on the protective layer 113, it is desirable to form the layer after the opening is filled with a filler layer 121 made of an organic material etc.

Next, a repair method will be described.

The repair method will be described with reference to the schematic sectional view of FIG. 3 showing the structure in which the metallic film and the second semiconductor layer which are located above the TFT region are removed.

Figure 4:
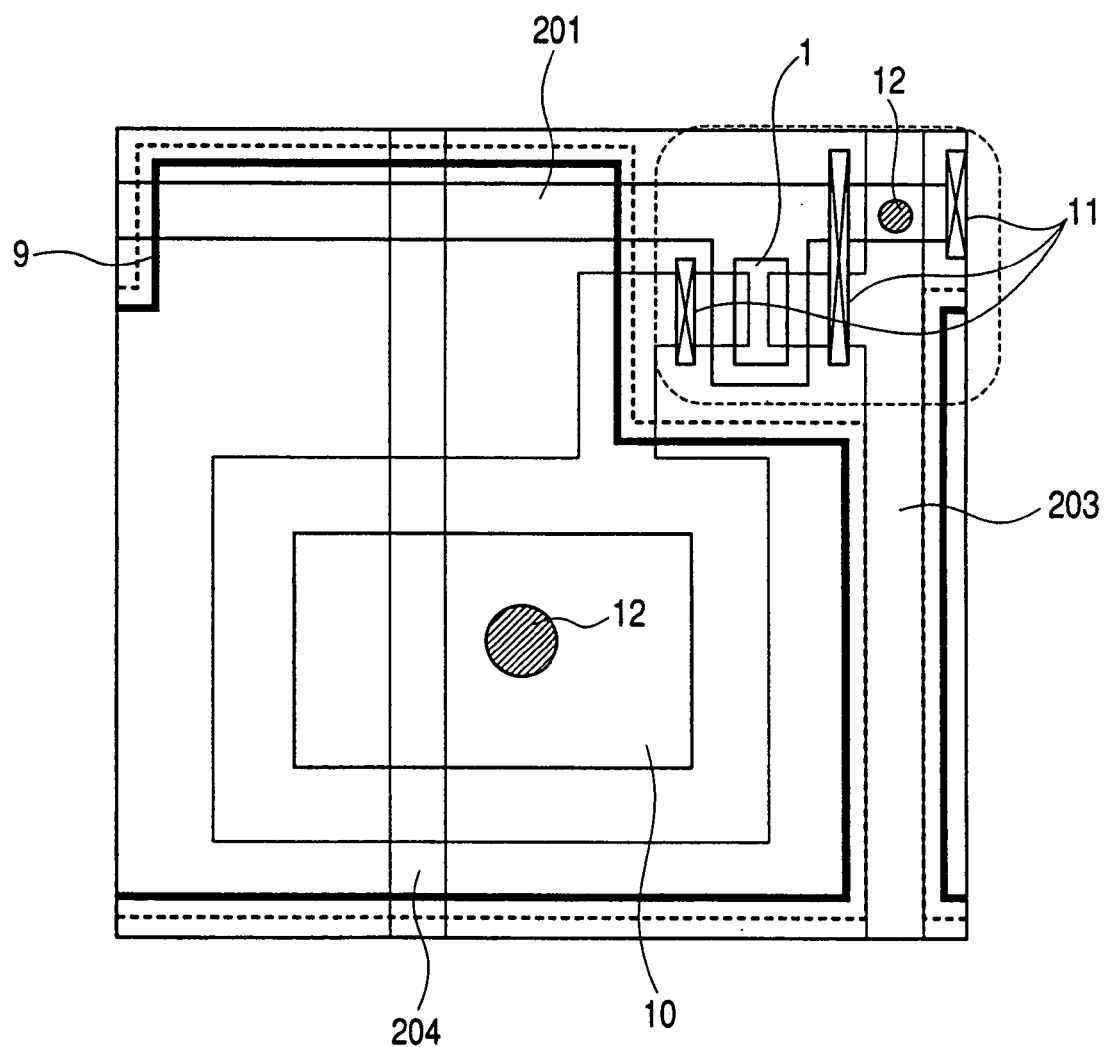
FIG. 4 is a schematic plan view of a pixel region of the image pickup apparatus according to the first embodiment of the present invention.

In FIG. 4, reference numeral 1 denotes the TFT; 9, a lower electrode of the photoelectric conversion element; 10, a contact hole; 203, the signal wiring; 201, the drive wiring of the TFT 1; 204, the bias wiring; 11, an image of repair; and 12, an image of a defect (leak occurrence portion resulting from a foreign matter). FIG. 4 shows an example where the defect (defective image 12) such as the leakage in the photo diode 4 or the leakage between the signal wiring 203 and the TFT drive wiring 201 occurs. In this case shown in FIG. 4, four portions in total of the leakage in the drain electrode and the source electrode of the TFT, and both sides of the cross portion where the TFT drive wiring and the signal wiring cross each other, are cut with the laser irradiation for the repair.

In the case where a defect such as a leakage of the photo diode 4, a leakage of the TFT 1, or a leakage between the signal wiring 203 and the TFT drive wiring 201 is repaired, in order to electrically separate the signal wiring 203, the TFT drive wiring 201, and the bias wiring 204 from one another, it is preferable to cut the wirings mainly in the TFT region.

Even if a disconnection is caused on a line of the TFT drive wirings 201, the TFTs can be controlled by providing the gate driver on each of both sides of the pixel portion. Similarly, in the case where redundant wirings or the like for the bias wirings 204 are provided and connections (all line connections) are conducted from both sides of the pixel portion, the photo diodes can be controlled.

In contrast to this, if the signal wiring 203 is cut, signal processing is adversely affected or processing becomes complicated. Therefore, in this embodiment, an example in which the wirings other than the signal wirings 203 are cut for repair will be described. Note that if amplifier ICs can be arranged on both sides of the signal wiring, even when the disconnection occurs at one portion on a line, the signal can be output. In such cases, the lower electrode of the photo diode above the signal wiring is removed and the signal wiring may be cut as well.

As described above, according to the repair technique using laser light, if the plurality of metallic films are located in the laser irradiation region, these metallic films are short-circuited in melting in some conditions. Therefore, it is preferable to conduct repair in a region in which two or more wirings are not overlapped with one another. If the metallic film (third conductive layer) or the Si film of the thick film (second semiconductor layer) is located in a wiring portion to be repaired, a defect in which cut processing precision is reduced or cutting is impossible is caused.

According to this embodiment, in order to conduct stable repair, as shown by a thick line (lower electrode 9 of the photo diode) and a broken line (location region of the second semiconductor layer) in FIG. 4, the opening is provided above the TFT region, and the overlap portion (cross portion) of the TFT drive wiring and the signal wiring and its vicinities.

In FIG. 4, the pixel region has a shape in which another opening is formed in the second semiconductor layer in addition to the opening located above the TFT region to conduct element separation. If the pixel separation is conducted on the lower electrode of the photo diode and the n-type semiconductor layer, the openings in the second semiconductor layer and the p-type semiconductor layer may be formed above only the TFT region and the pixels may be connected with one other.

As shown in FIG. 4, if the formation area of the semiconductor layer is made wider than the formation area of the pixel electrode, the risk of short circuit becomes lower, which is favorable.

According to this embodiment, in the image pickup apparatus using the plurality of pixels, each of which includes the TFT having the first semiconductor layer and the semiconductor conversion element having the second semiconductor layer and the electrodes, the defect portion, typically, the element short circuit portion in the semiconductor conversion element, the TFT short circuit portion, or the like, is stably processed by laser repair.

Second Embodiment

In this embodiment, an example of an image pickup apparatus having pixels, each of which includes a switching element composed of a TFT and a semiconductor conversion element of the MIS type will be described with reference to FIGS. 5 to 14.

Figure 5:
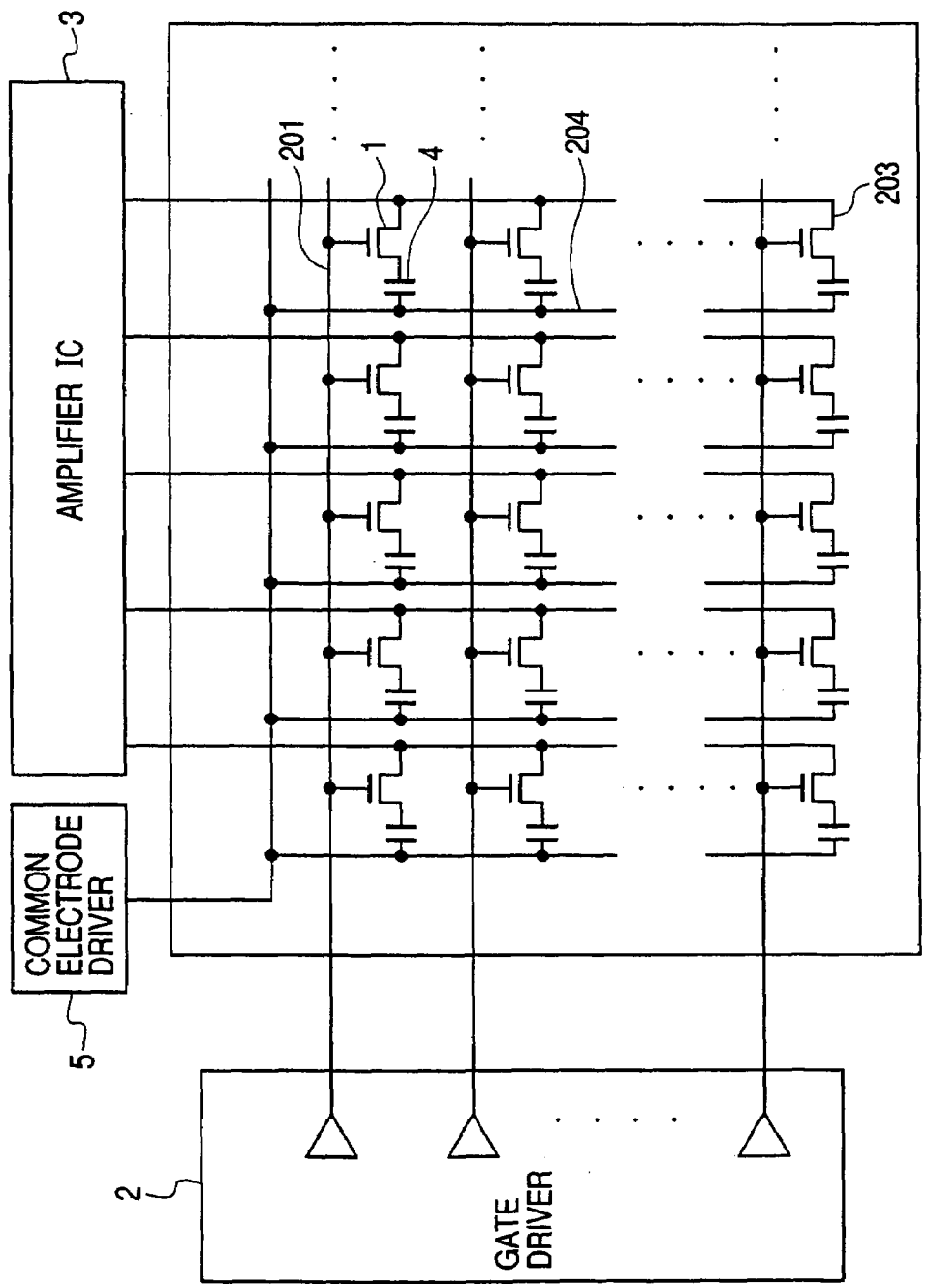
FIG. 5 is a schematic equivalent circuit diagram of an image pickup apparatus according to a second embodiment of the present invention.

FIG. 5 is a schematic equivalent circuit diagram according to this embodiment.

In FIG. 5, drive wirings 201 common to the TFTs 1 are connected with a gate driver 2 that controls turning on/off of each of the TFTs 1. The source or drain electrode of each of the TFTs 1 is connected with one of common signal wirings 203. The signal wirings 203 are connected with an amplifier IC 3. Bias wirings 204 for driving the semiconductor conversion element 4 of the MIS type are connected with a common electrode driver 5.

Figure 6:
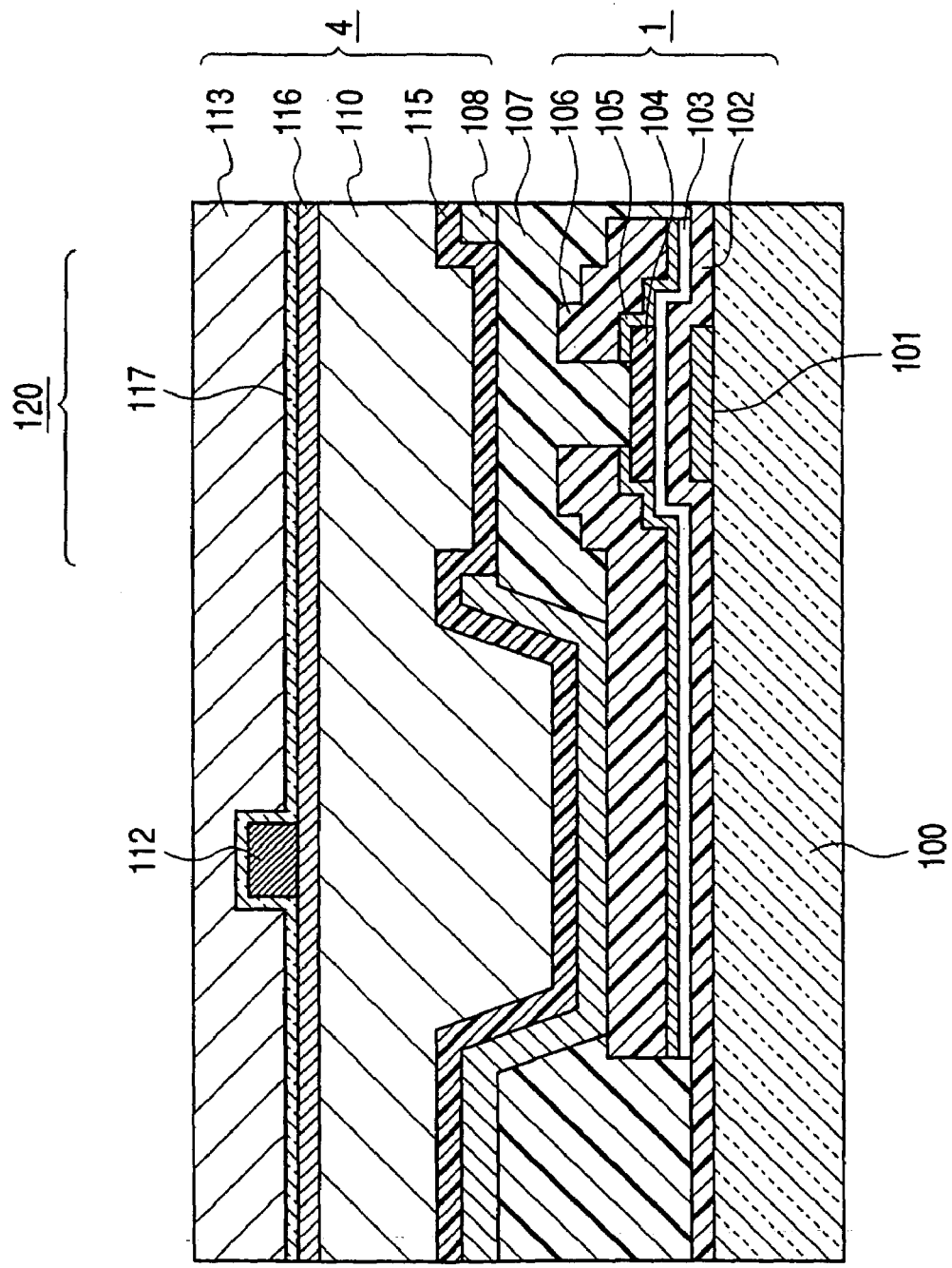
FIG. 6 is a schematic sectional view of the image pickup apparatus according to the second embodiment of the present invention.
Figure 7:
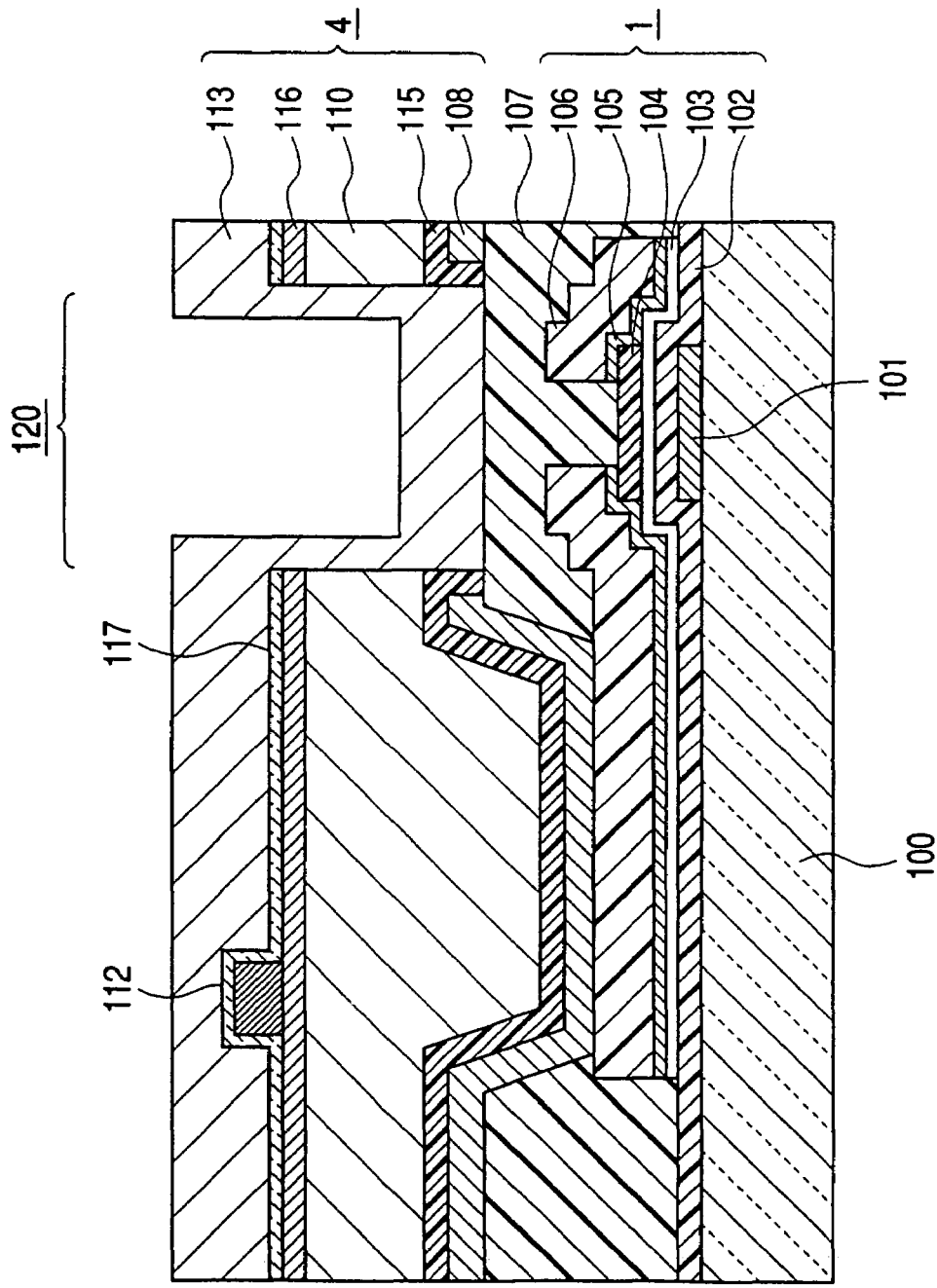
FIG. 7 is a schematic sectional view of the image pickup apparatus according to the second embodiment of the present invention.
Figure 8:
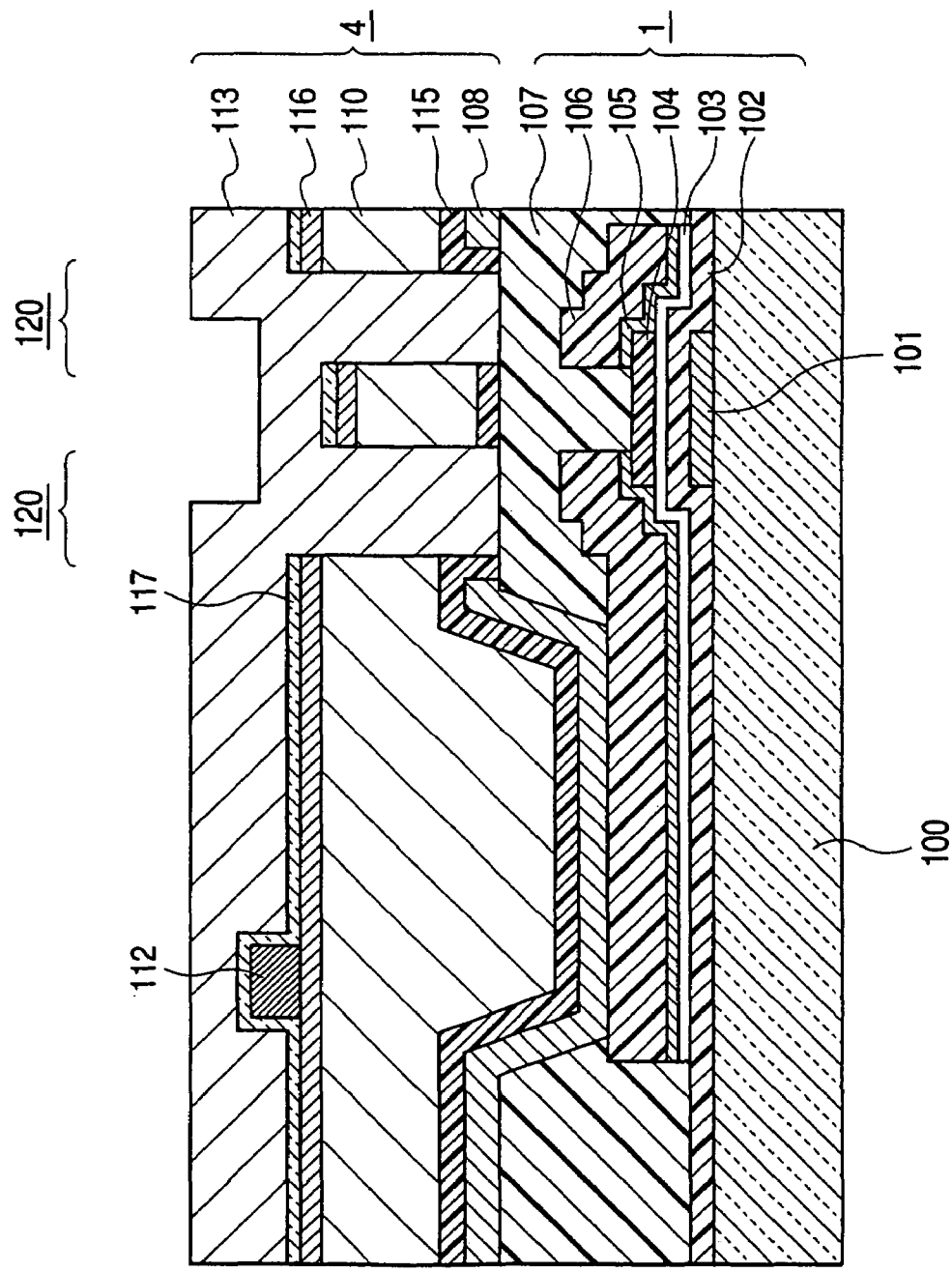
FIG. 8 is a schematic sectional view of the image pickup apparatus according to the second embodiment of the present invention.

FIGS. 6 to 8 are schematic sectional views according to this embodiment.

In FIG. 6, a metallic film 108 which is located in a region corresponding to the TFT 1 is removed to form an opening 120. In FIG. 7, a transparent conductive film 117, a second ohmic contact layer 116, a second semiconductor layer 110, and a fourth semiconductor layer 115 which are located on the upper surface of the region corresponding to the TFT 1 are removed to form an opening 120.

In FIG. 8, the metallic film 108 located above the region corresponding to the TFT 1 is removed. In addition, the transparent conductive film 117, the second ohmic contact layer 116, the second semiconductor layer 110, and the fourth insulating layer 115 are removed in a portion excluding the active region (channel) between the source and the drain and the region in which the TFT drive wiring and the source and drain electrodes are overlapped with one another, thereby forming the openings 120.

Examples of a layer structure of the image pickup apparatus according to this embodiment will be described with reference to FIGS. 6 to 8.

A first conductive layer 101 (for example, AlNd/Mo, 2500 angstroms) is formed on a substrate 100 by sputtering and then the TFT drive wiring is formed. Next, a first insulating layer 102 (for example, SiN, 3000 angstroms), a first semiconductor layer 103 (for example, a-Si, 500 angstroms), and a second insulating layer (channel protective layer) 104 (for example, SiN, 2000 angstroms) are formed in succession in the stated order on the substrate 100 and the TFT drive wiring by a CVD method. After that, using a resist image (not shown) formed by rear exposure, the second insulating layer (channel protective layer) 104 is etched so as to be left only above the TFT drive wiring.

Here, in order to improve the transfer capability of the TFT by reducing a parasitic capacitance produced due to overlap of a signal wiring side electrode with the TFT drive wiring in a TFT portion, an etching stopper type TFT is formed using the rear exposure.

Subsequently, a first ohmic contact layer 105 (for example, n-type a-Si, 200 angstroms) is formed by a CVD method and a second conductive layer 106 (for example, AlNd/Mo, 4000 angstroms) is formed on the ohmic contact layer by sputtering. Next, the second conductive layer 106 is patterned by wet etching to form the source and drain electrodes and the signal wiring of the TFT. After that, the source-drain separation of the first ohmic contact layer 105 and the element separation of the first semiconductor layer 103 are conducted by dry etching.

Next, a third insulating layer 107 (for example, an organic film of benzocyclobutene (BCB) or polyimide (PI)) is deposited as a planarizing film and a contact hole is formed on the electrode of the TFT. Then, a third conductive layer 108 (for example, AlNd/Mo, 2000 angstroms) is formed by sputtering to be connected with the TFT through the contact hole and to compose the lower electrode of the photoelectric conversion element. The drain electrode of the TFT is formed up to the lower electrode of the photo diode and connected therewith through a contact hole.

As shown in FIGS. 6 to 8, the lower electrode (pixel electrode) of the photo diode is formed outside the region where at least two of the TFT drive wiring (with the protruded portion serving as the gate electrode), the source and drain electrodes of the TFT, and the signal wiring overlap each other, exclusive of at least part of the region above the TFT drive wiring (including the gate electrode) and at least part of the region above the source and drain electrodes of the TFT. Here, the lower electrode of the photo diode in the overlap portion (cross portion) of the signal wiring, the TFT constituting portion, the TFT drive wiring, and the signal wiring, and its vicinities is removed. In its vicinities, at least the drive wiring and the source and drain electrodes of the TFT extend. The drive wiring and the source and drain electrodes of the TFT can be cut with the laser irradiation. Note that the lower electrode of the photo diode may remain in the overlap portion between the TFT drive wiring and the signal wiring and the overlap portion between the gate electrode of the TFT and the source and drain electrodes thereof. In short, the lower electrode of the photo diode has only to be removed to such an extent as to enable the repair described below.

Subsequently, the fourth semiconductor layer 115 (for example, SiN, 2000 angstroms), the second semiconductor layer 110 (for example, a-Si, 5000 angstroms), and the second ohmic contact layer 116 (for example, $n^+$-type a-Si, 500 angstroms) are formed in succession in the stated order by a CVD method. Then, a fourth conductive layer 112 (for example, Mo/Al/Mo, 4000 angstroms) is formed by sputtering to form the bias wiring of the photo diode.

Further, the transparent conductive film 117 (for example, ITO, 300 angstroms) is formed as the upper electrode of the photoelectric conversion element by sputtering. Thus, the image pickup apparatus having the structure shown in FIG. 6 is completed.

With respect to another example of this embodiment, as shown in FIG. 7, the second ohmic contact layer 116, the second semiconductor layer 110, and the fourth insulating layer 115 may be also formed corresponding to the upper electrode of the photoelectric conversion element. The trans-parent conductive film 117, the fourth insulating layer 115, the second semiconductor layer 110, and the second ohmic contact layer 116 each are removed using wet etching or dry etching such that the transparent conductive film 117, the fourth insulating layer 115, the second semiconductor layer 110, and the second ohmic contact layer 116 do not cover at least the upper surface of the region in which the TFT drive wiring of the TFT region, the source and drain electrodes of the TFT, and the signal wiring are not overlapped with one another.

Also, the fourth insulating layer 115 located above the TFT region may be left. Even in the case where the second high resistance semiconductor layer 110 is thinned by half etching, processing using the laser repair is stabilized.

Further, as shown in FIG. 8, in the case where the transparent conductive film 117, the second ohmic contact layer 116, the second semiconductor layer 110, and the fourth insulating layer 115 are left in only the active region between the source and the drain in the TFT region, the processing using the laser repair is stably conducted as in the cases shown in FIGS. 6 and 7. In addition, in the case where the second semiconductor layer 110 having a high light absorbency is left in the active region between the source and the drain of the TFT without being thinned, the leakage amount of light (noise) in the TFT is reduced to improve the performance, which is further favorable.

Subsequently, the protective layer 113 (for example, SiN and an organic film) is formed, electrical testing is conducted, and the laser repair is conducted on a defect portion if necessary. After that, in this embodiment, the phosphor layer 119 as the wavelength converting layer is formed in the radiation incident surface. As the phosphor layer, the phosphor layer formed of $Gd_2O_2S$, CsI, etc. for converting the radiation such as the X-ray to the visible light is formed. Here, the phosphor layer 119 is directly formed on the protective layer 113, but may be formed on the sheet to bond the sheet onto the protective layer 113 through the adhesive layer. In the structure of FIG. 7, when the phosphor layer 119 is directly formed on the protective layer 113, it is desirable to form the layer after the opening is filled with a filler layer 121 made of an organic material etc.

Next, a repair method will be described. Description will be made using a structure in which the metallic film and the second semiconductor layer which are located above the TFT region are removed as shown in FIG. 7.

In FIGS. 9 to 14, reference numeral 1 denotes the TFT; 9, a lower electrode of the photoelectric conversion element; 10, a contact hole; 203, the signal wiring; 201, the drive wiring of the TFT 1; 204, the bias wiring; 11, an image of repair; and 12, an image of a defect (leak occurrence portion resulting from a foreign matter).

Figure 9:
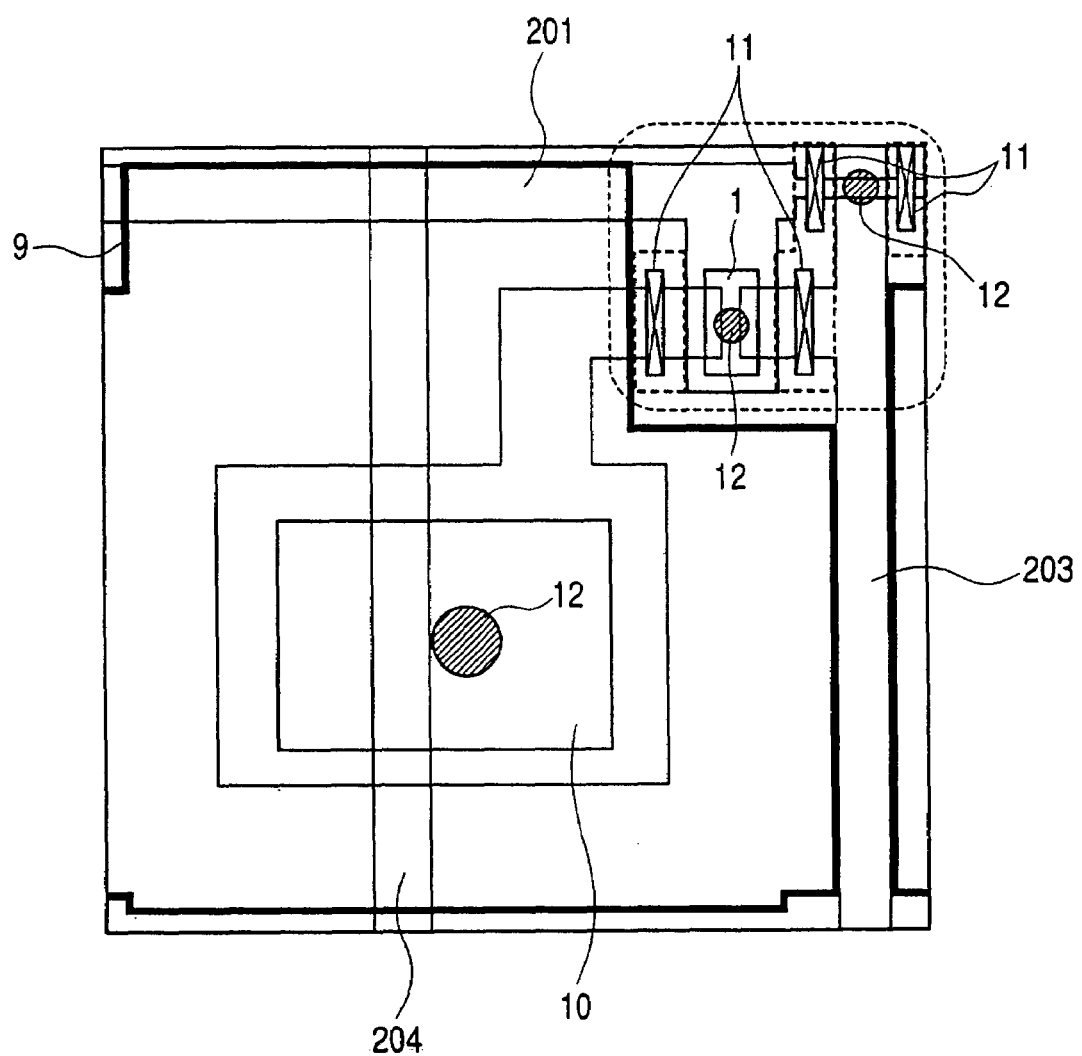
FIG. 9 is a schematic plan view of a pixel region of the image pickup apparatus according to the second embodiment of the present invention.
Figure 10:
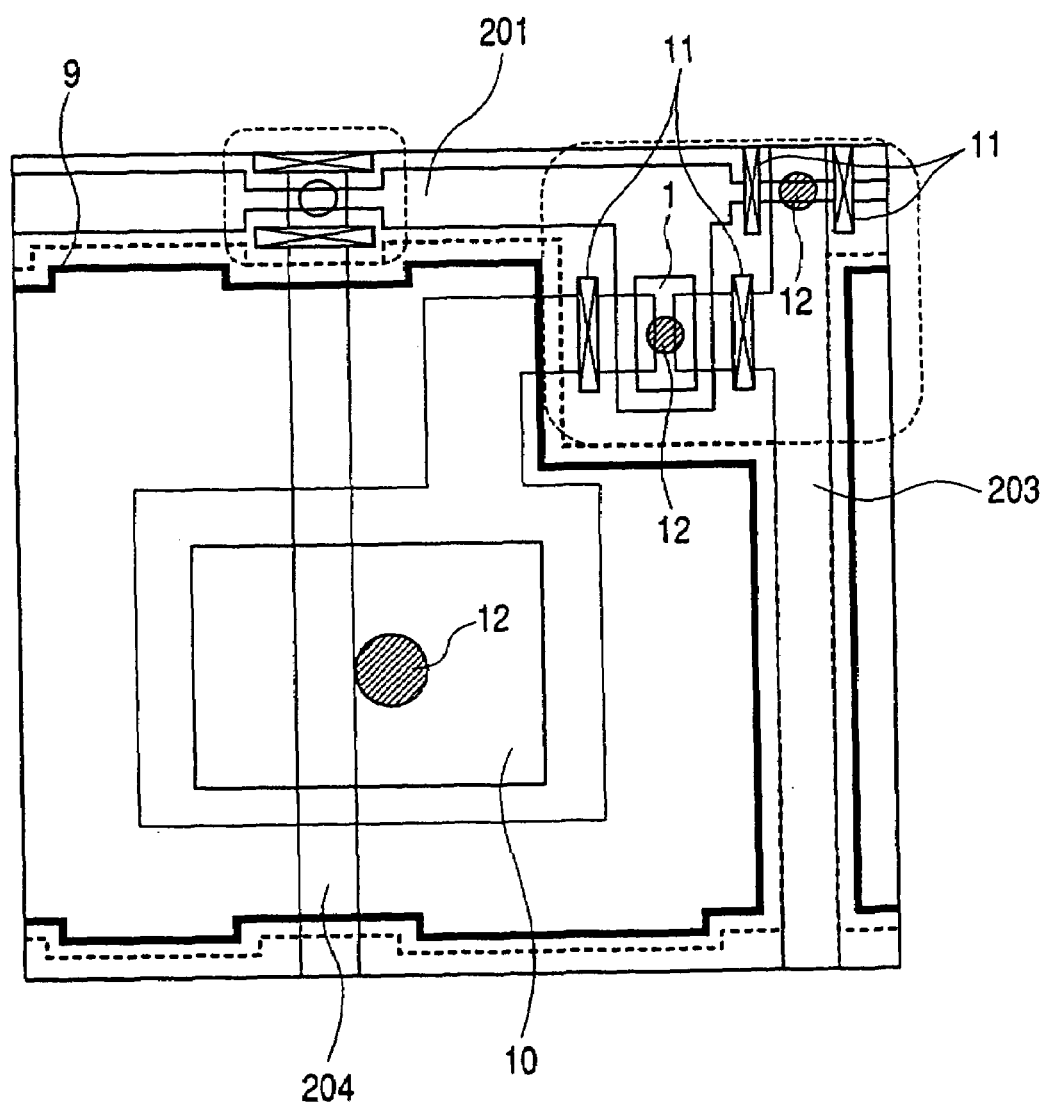
FIG. 10 is a schematic plan view of a pixel region of the image pickup apparatus according to the second embodiment of the present invention.
Figure 11:
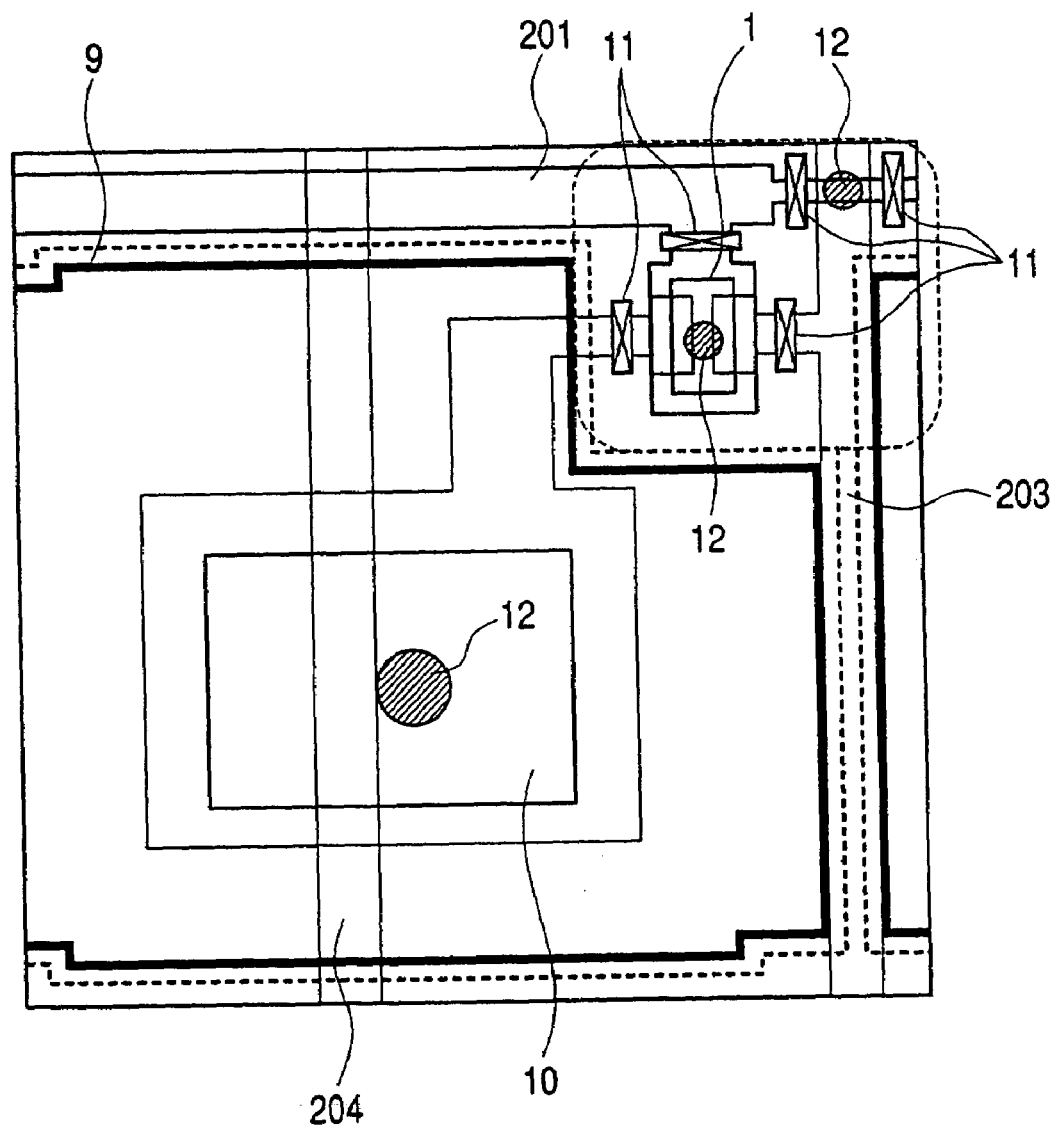
FIG. 11 is a schematic plan view of a pixel region of the image pickup apparatus according to the second embodiment of the present invention.
Figure 12:
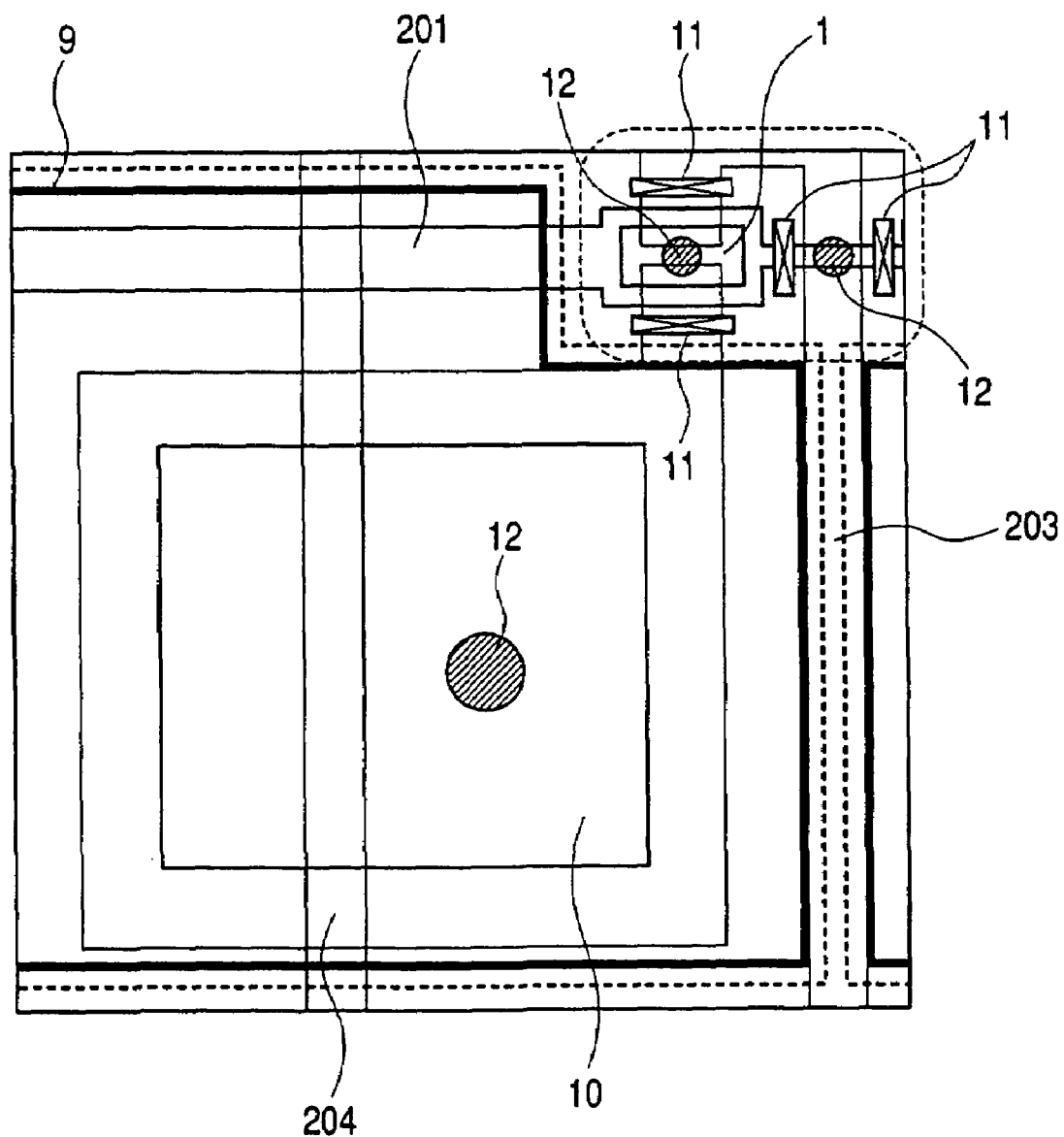
FIG. 12 is a schematic plan view of a pixel region of the image pickup apparatus according to the second embodiment of the present invention.
Figure 13:
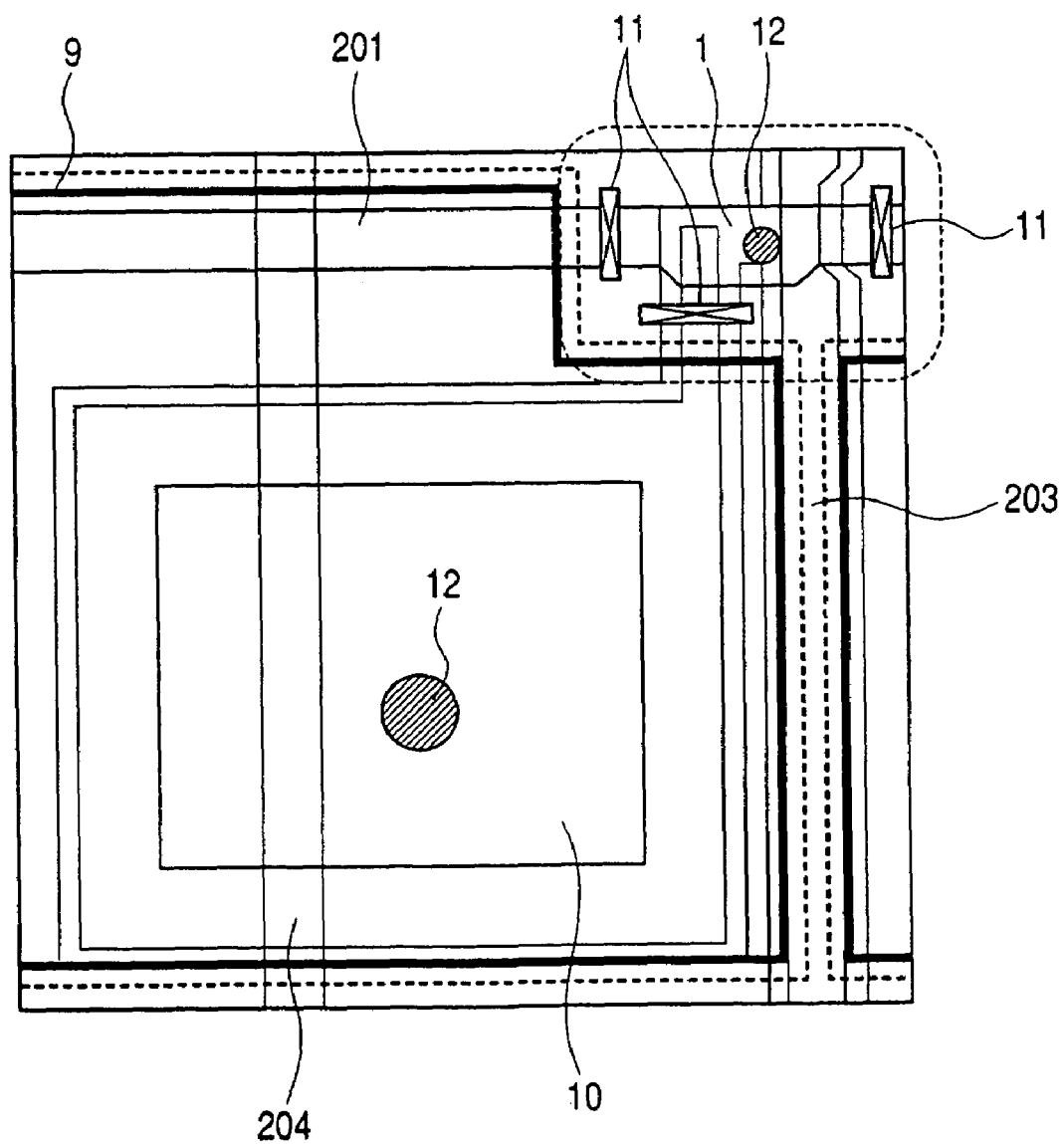
FIG. 13 is a schematic plan view of a pixel region of the image pickup apparatus according to the second embodiment of the present invention.
Figure 14:
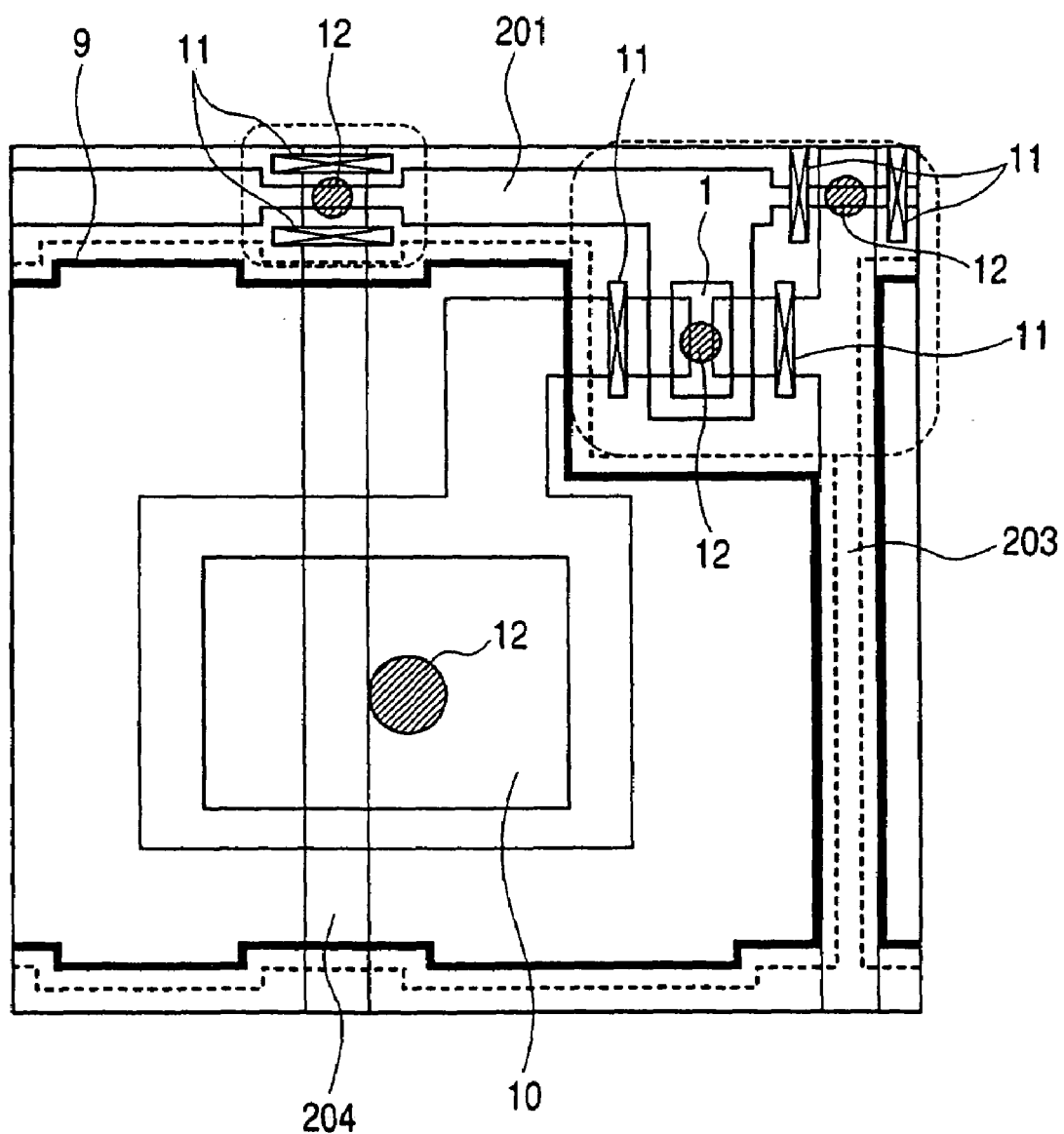
FIG. 14 is a schematic plan view of a pixel region of the image pickup apparatus according to the second embodiment of the present invention.

In the case where a defect such as a leakage of the photoelectric conversion element, a leakage of the TFT 1, or a leakage between the signal wiring 203 and the TFT drive wiring 201 is repaired, in order to electrically separate the signal wiring 203, the TFT drive wiring 201, and the bias wiring 204 from one another, it is preferable to cut the wirings mainly in the TFT region. FIGS. 9 and 12 show an example where the defects such as the leakage in the photoelectric conversion element and in the TFT 1 and the leakage between the signal wiring 203 and the TFT drive wiring 201 occur. In this case shown in the figures, four portions in total of the leakage in the drain electrode and the source electrode of the TFT, and both sides of the cross portion where the TFT drive wiring and the signal wiring cross each other, are cut with the laser irradiation for the repair. FIGS. 10 and 14 show the case where defects such as the leakage in the photoelectric conversion element and in the TFT 1, the leakage between the signal wiring 203 and the TFT drive wiring 201, and the leakage between the bias wiring and the TFT drive wiring occur. In this case shown in the figures, six portions in total of leakage in the drain electrode and the source electrode of the TFT, both sides of the cross portion where the TFT drive wiring and the signal wiring cross each other, and both sides of the cross portion where the bias wiring and the TFT drive wiring cross each other, are cut with the laser irradiation for the repair. FIG. 11 shows an example where the defects such as the leakage in the photoelectric conversion element and in the TFT 1 and the leakage between the signal wiring 203 and the TFT drive wiring 201 occur. In this case shown in the figure, five portions in total of leakage in the drain electrode and the source electrode of the TFT, in the TFT drive wiring (gate electrode), and both sides of the cross portion where the TFT drive wiring and the signal wiring cross each other are cut with the laser irradiation for the repair. FIG. 13 shows an example where the defects such as the leakage in the photoelectric conversion element and in the TFT 1 occur. In this case shown in the figure, three portions in total of leakage in the drain electrode of the TFT, and both sides of the cross portion where the TFT drive wiring and the signal wiring cross each other are cut with the laser irradiation for the repair. Note that in the structures shown in FIGS. 10, 11, and 14, the lower electrode of the photoelectric conversion element does not overlap the TFT drive wiring.

Even if a disconnection is caused on a line of the TFT drive wirings 201, the TFTs can be controlled by providing the gate driver on each of both sides of the pixel portion. Similarly, in the case where redundant wirings or the like for the bias wirings 204 are provided and connections (all line connections) are conducted from both sides of the pixel portion, the photoelectric conversion element can be controlled.

In contrast to this, if the signal wiring 203 is cut, signal processing is adversely affected or processing becomes complicated. Therefore, in this embodiment, an example in which the wirings other than the signal wirings 203 are cut for repair will be described. Note that if amplifier ICs can be arranged on both sides of the signal wirings, even when the disconnection occurs at one portion on a line, the signal can be output. In such cases, the lower electrode of the photo diode above the signal wiring is removed and the signal wiring may be cut as well.

As described above, according to the repair technique using laser light, if the plurality of metallic films are located in the laser irradiation region, these metallic films are short-circuited in melting and evaporating depending on the conditions. Therefore, it is preferable to conduct repair in a region in which two or more wirings are not overlapped with one another. If the metallic film (third conductive layer) or the Si film which is thick (second semiconductor layer) is located in a wiring portion to be repaired, a defect such as cut processing precision is reduced or cutting is impossible is caused.

According to this embodiment, in order to conduct stable repair, as shown by a thick line (lower electrode 9 of the photoelectric conversion element) and a broken line (location region of the second semiconductor layer) in FIGS. 9 to 14, the opening is provided above a repair section (region in which the plurality of wirings are not overlapped with one another) of the TFT region.

In FIG. 9, the lower electrode 9 of the photoelectric conversion element is formed such that the TFT region is opened for the pixel separation. Further, the second semiconductor layer is not separated for each pixel, and only the region in which the TFT drive wiring 201 of the TFT region, the source and drain electrodes of the TFT region, and the signal wiring 203 are not overlapped with one another is opened.

Therefore, when a defect such as a leakage in the photoelectric conversion element, a leakage in the TFT, a leakage in a cross portion between the signal wiring 203 and the TFT drive wiring 201, or the like is caused, it is possible to cut the TFT drive wiring 201, and the source and drain electrodes.

In FIG. 10, both the lower electrode 9 of the photoelectric conversion element and the second semiconductor layer are formed so as to allow the TFT region to be opened. Further, an opening portion is formed in the intersection between the bias wiring 204 and the TFT drive wiring 201.

Therefore, when a defect such as a leakage in the photoelectric conversion element, a leakage in the TFT, a leakage in a cross portion between the signal wiring 203 and the TFT drive wiring 201, a leakage in a cross portion between the bias wiring 204 and the TFT drive wiring 201, or the like is caused, it is possible to cut the TFT drive wiring 201, the source and drain electrodes, and the bias wiring 204.

In FIG. 11, both the lower electrode 9 of the photoelectric conversion element and the location region in which at least the second semiconductor layer is located are formed so as to allow the TFT region to be opened. Further, the source and drain electrodes of the TFT, the signal wiring 203, and a portion of the TFT drive wiring 201 each are formed so as to be partially thinned in a line width, thereby narrowing the laser irradiation region. Accordingly, repair can be conducted with higher precision.

As shown in FIG. 12, the TFT 1 may be formed above the TFT drive wiring 201.

The TFT 1 shown in FIG. 13 is a channel etch type. Here, both the lower electrode 9 of the photoelectric conversion element and the location region in which at least the second semiconductor layer is located are formed so as to allow the TFT region to be widely open. Alternatively, as in the cases of FIGS. 9 to 11, only a minimum region may be opened.

Therefore, when a defect such as a leakage in the photoelectric conversion element, a leakage in the TFT, a leakage in a cross portion between the signal wiring 203 and the TFT drive wiring 201, or the like is caused, it is possible to cut the TFT drive wiring 201, and the source and drain electrodes.

FIG. 14 shows a shape in the case where at least the second semiconductor layer is left in the active region between the source and the drain of the TFT as shown in FIG. 8. The second high resistance semiconductor layer left here may be connected with the photoelectric conversion element without being processed. The lower electrode 9 of the photoelectric conversion element may be expanded to the active region. A wiring is made narrower in each wiring cross portion than in other portions.

According to this embodiment, in a radiation detecting device which includes the TFTs each having the first semiconductor layer and the photoelectric conversion elements each having the second semiconductor layer and the electrodes which are formed above the TFT, the defect portion, typically, the element short circuit portion in the photoelectric conversion element, the TFT short circuit portion, or the like, can be stably processed by laser repair. Thus, the manufacturing yield can be improved.

Third Embodiment

In this embodiment, an example of an image pickup apparatus having pixels, each of which includes a switching element composed of a TFT and a semiconductor conversion element of the MIS type (photoelectric conversion element) will be described with reference to FIGS. 15 to 18.

Figure 15:
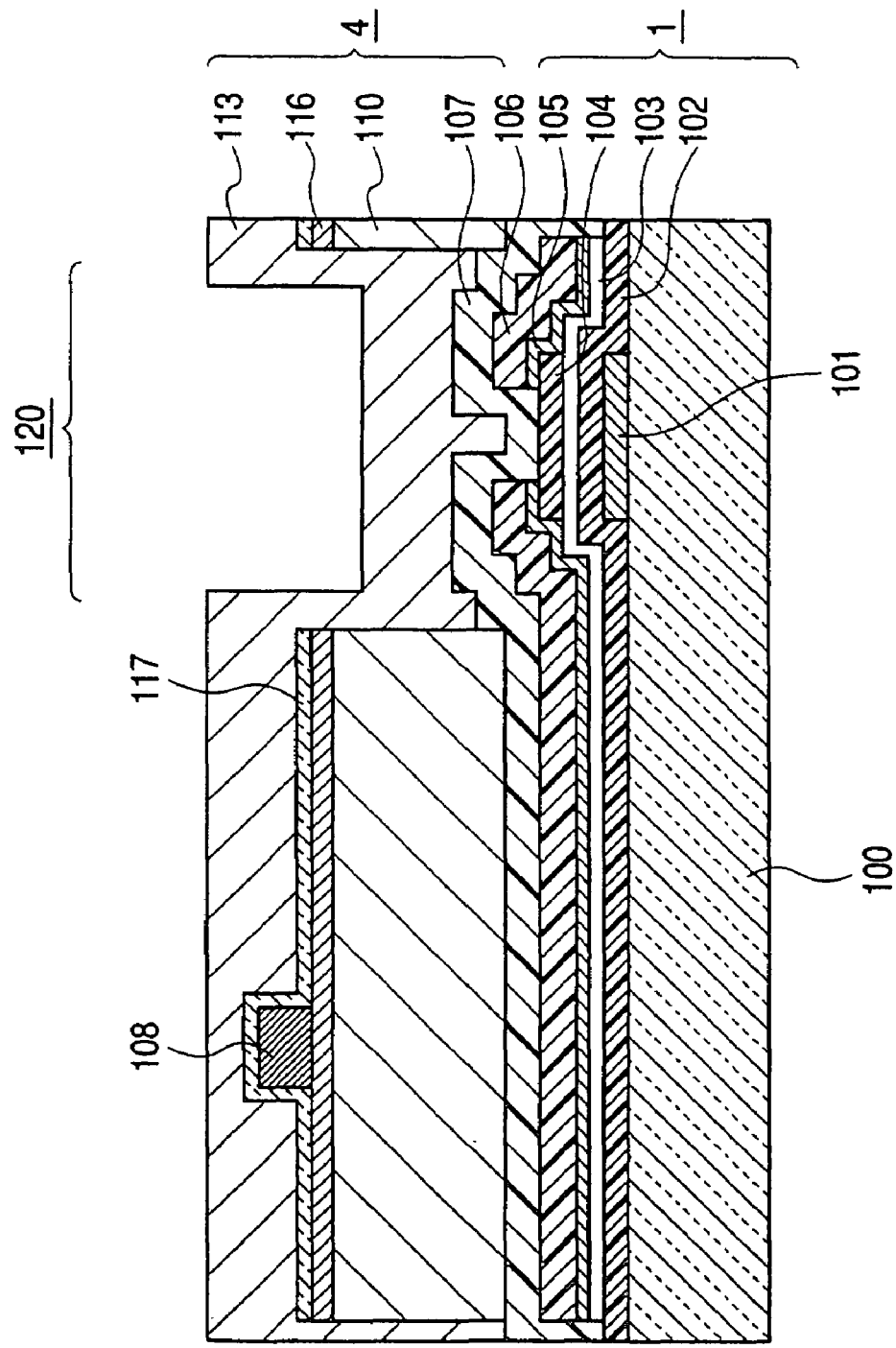
FIG. 15 is a schematic sectional view of an image pickup apparatus according to a third embodiment of the present invention.
Figure 16:
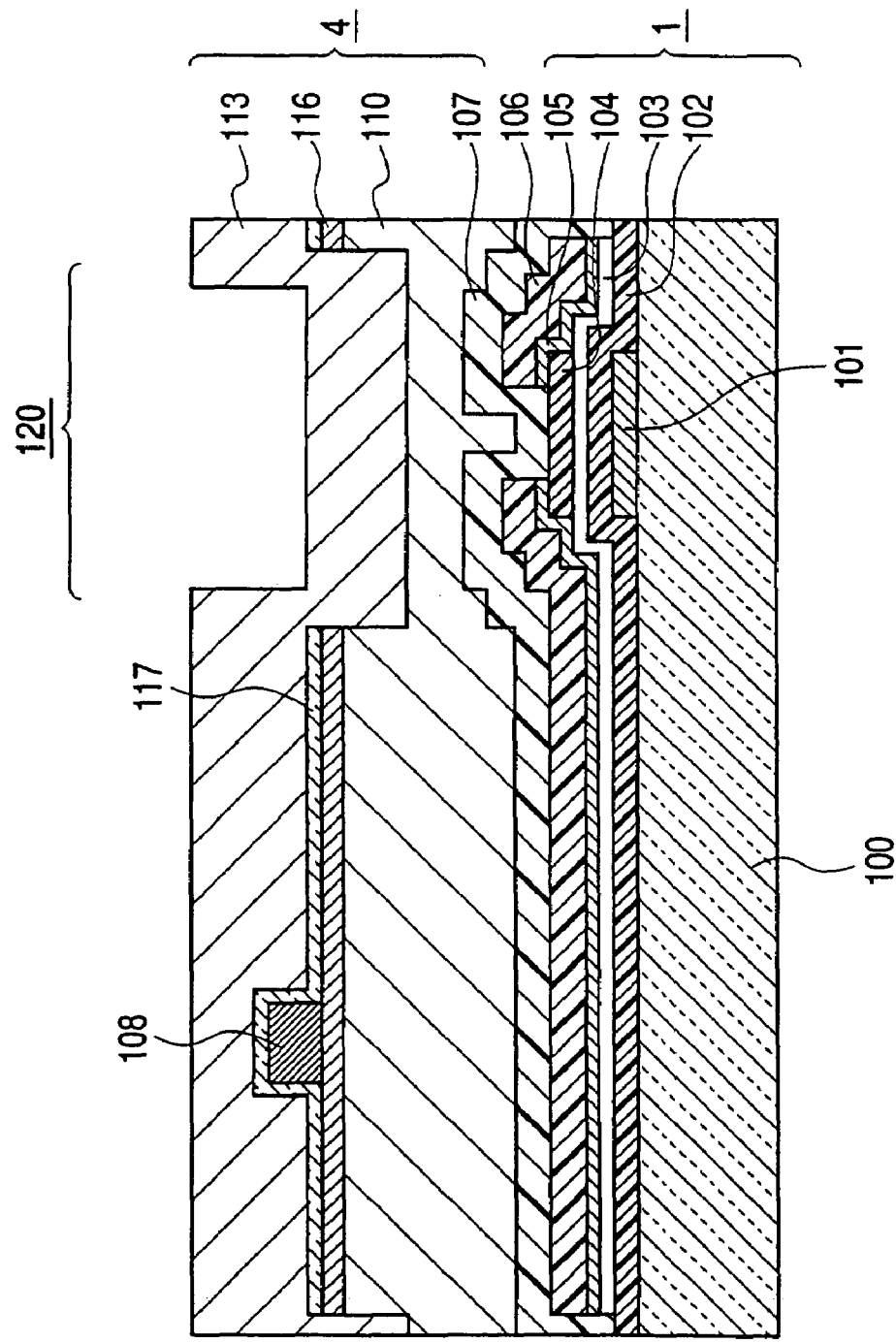
FIG. 16 is a schematic sectional view of the image pickup apparatus according to the third embodiment of the present invention.

A schematic equivalent circuit diagram of this embodiment is the same as that shown in FIG. 5 in the second embodiment. FIGS. 15 and 16 show a schematic sectional view of an image pickup apparatus according to this embodiment.

In FIG. 15, the metallic film 108, the transparent conductive film 117, the second ohmic contact layer 116, and the second semiconductor layer 110 which are located above the region corresponding to the TFT 1 are removed to form an opening 120.

In FIG. 16, the metallic film 108, the transparent conductive film 117, and the second ohmic contact layer 116 which are located above the region corresponding to the TFT 1 are removed to form the opening 120. Further, the second semiconductor layer 110 is made thinner in the region corresponding to the TFT 1 than in other regions.

Examples of a layer structure of the image pickup apparatus according to this embodiment will be described with reference to FIGS. 15 and 16. First, a first conductive layer 101 (for example, AlNd/Mo, 2500 angstroms) is formed on a glass substrate 100 by sputtering and then the TFT drive wiring 201 is formed. Next, a first insulating layer 102 (for example, SiN, 3000 angstroms), a first semiconductor layer 103 (for example, a-Si, 500 angstroms), and a second insulating layer (channel protective layer) 104 (for example, SiN, 2000 angstroms) are formed in succession in the stated order on the glass substrate 100 and the TFT drive wiring by a CVD method. After that, using a resist image formed by rear exposure, the second insulating layer (channel protective layer) 104 is etched so as to be left only above the TFT drive wiring.

Here, in order to improve the transfer capability of the TFT and to reduce a parasitic capacitance produced due to overlap of a signal wiring side electrode with the TFT drive wiring in a TFT portion, it is preferable to form an etching stopper type TFT using the rear exposure.

Subsequently, a first ohmic contact layer 105 (for example, n$^+$-type a-Si, 200 angstroms) is formed by a CVD method and a second conductive layer 106 (for example, AlNd/Mo, 4000 angstroms) is formed by sputtering. Next, the second conductive layer 106 is patterned by wet etching to form the lower electrode of a photoelectric conversion element, the source and drain electrodes and the signal wiring of the TFT. After that, the source-drain separation of the first ohmic contact layer 105 is conducted by dry etching, and the element separation of the first high resistance semiconductor layer 103 is conducted by etching.

Subsequently, the third insulating layer 107 (for example, SiN, 2000 angstroms) and second semiconductor layer 110 (for example, a-Si, 5000 angstroms), and the second ohmic contact layer 116 (for example, n$^+$-type a-Si, 500 angstroms) are formed in succession by a CVD method. Then, a third conductive layer 108 (for example, Mo/Al/Mo, 4000 angstroms) is formed by sputtering to form the bias wiring of the photo diode.

Further, the transparent conductive film 117 (for example, ITO, 300 angstroms) is formed as the upper electrode of the photoelectric conversion element by sputtering.

Then, the transparent conductive layer 117, the second ohmic contact layer 116, and the second semiconductor layer 110 are removed in a region outside a region where at least two of the TFT drive wiring (with the protruded portion serving as the gate electrode), the source and drain electrodes of the TFT, and the signal wiring overlap each other, exclusive of at least part of the region above the source and drain electrodes of the TFT, and part of the region above the TFT drive wiring (including the gate electrode) (here, the entire region above the TFT drive wiring is removed) by wet or dry etching. It is also possible to etch the third insulating layer.

Also, as described above in FIG. 16, the second semiconductor layer 110 is made thinner in the region corresponding to the region above the TFT region than in other regions. For example, the second semiconductor layer 110 is thinned by not complete etching but half etching. Even in this case, processing using the laser repair is stabilized.

Subsequently, the protective layer 113 (for example, SiN and an organic film) is formed, electrical testing is conducted, and the laser repair is conducted on a defect portion. After that, in this embodiment, the phosphor layer as the wavelength converting layer is formed in the radiation incident surface. As the phosphor layer, the phosphor layer formed of Gd$_2$O$_2$S, CsI, etc. for converting the radiation such as the X-ray to the visible light is formed. Here, the phosphor layer is directly formed on the protective layer 113, but may be formed on a sheet to bond the sheet onto the protective layer 113 through the adhesive layer.

Next, a repair method will be described. Description of the repair method will be made with reference to the structure in which the metallic film and the second semiconductor layer which are located above the TFT region are removed as shown in the schematic sectional view of FIG. 15.

Figure 17:
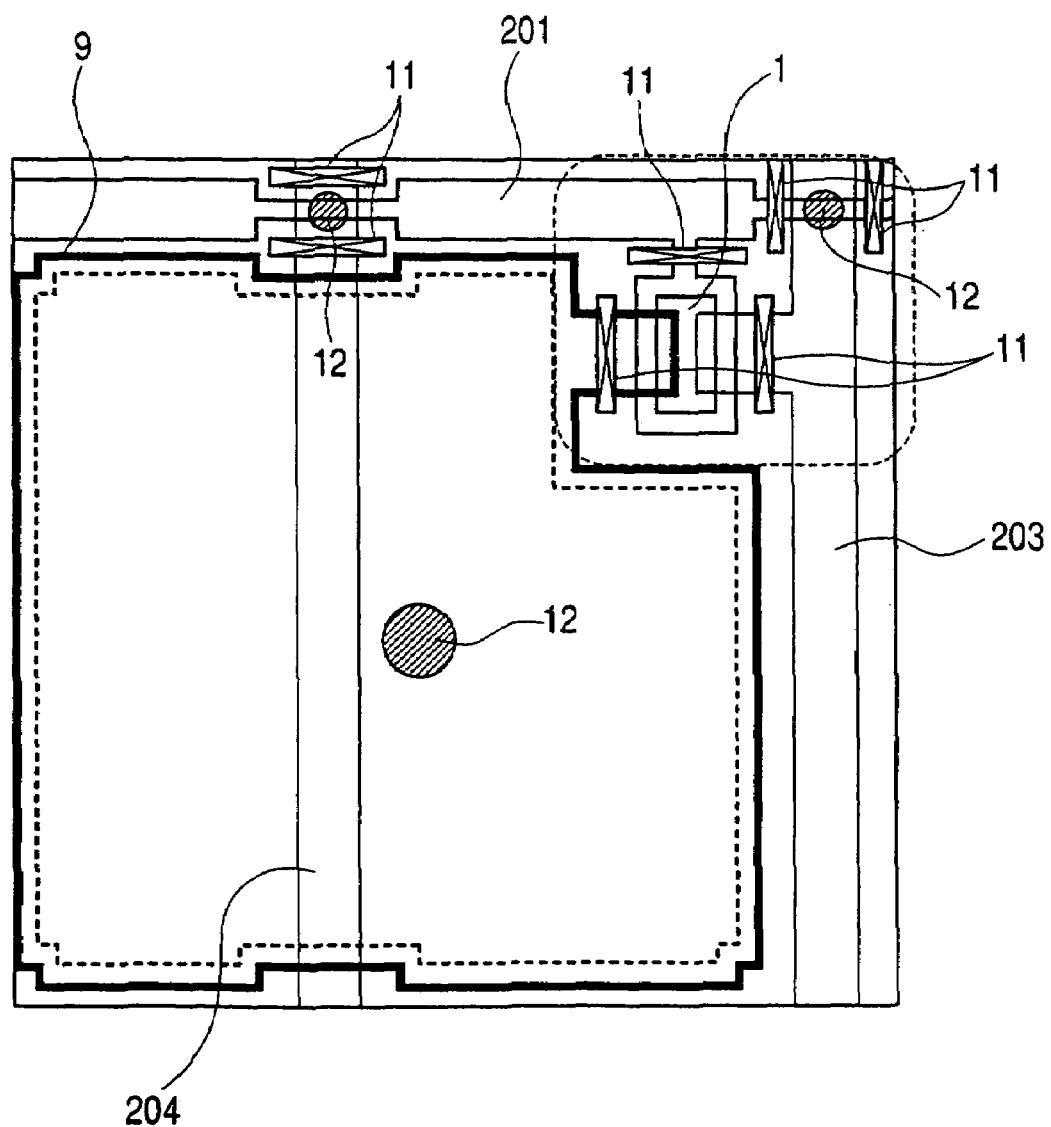
FIG. 17 is a schematic plan view of a pixel region of the image pickup apparatus according to the third embodiment of the present invention.
Figure 18:
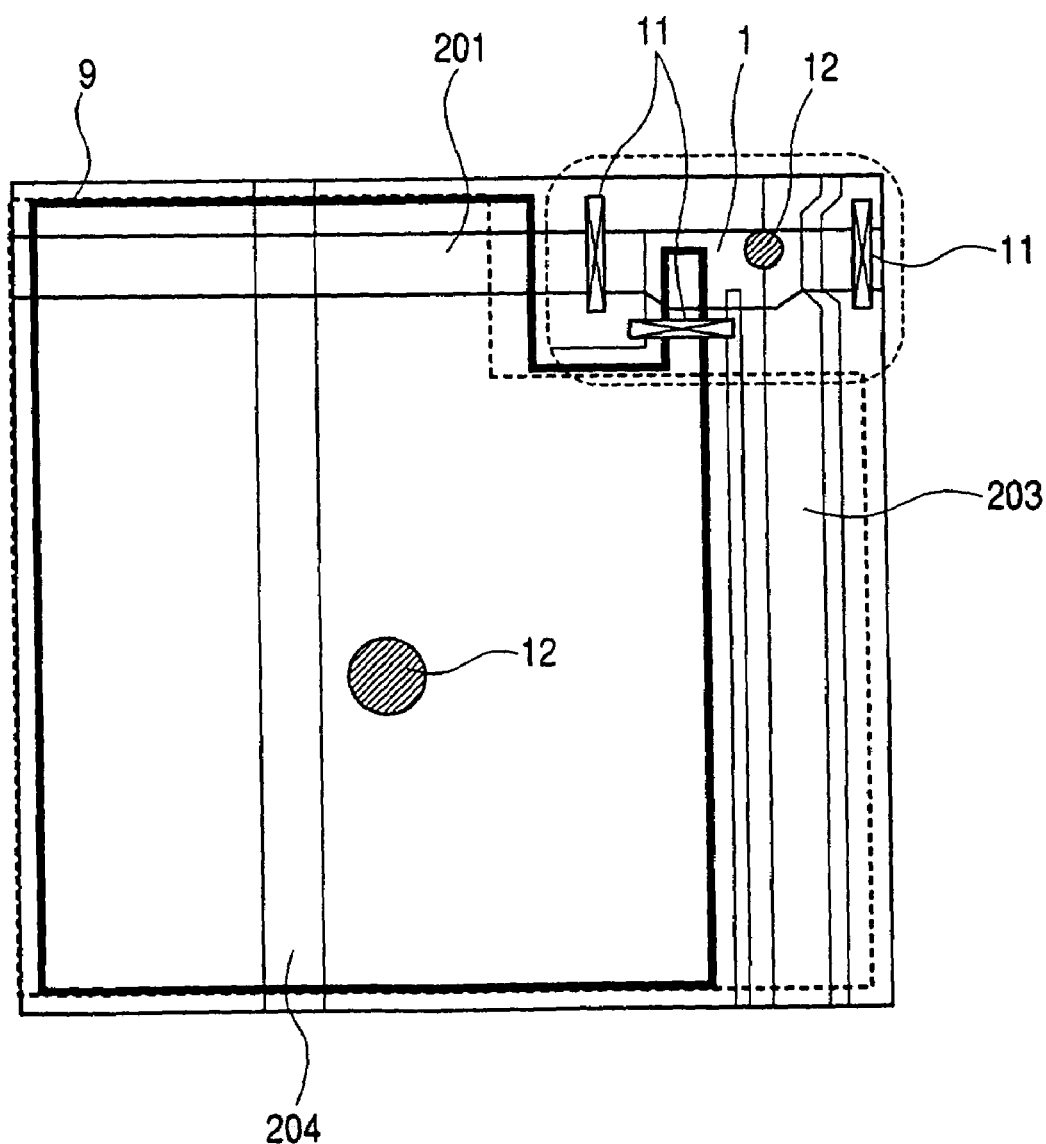
FIG. 18 is a schematic plan view of a pixel region of the image pickup apparatus according to the third embodiment of the present invention.

In FIGS. 17 and 18, reference numeral 1 denotes the TFT; 9, a lower electrode of the photoelectric conversion element; 203, the signal wiring; 201, the drive wiring of the TFT 1; 204, the bias wiring; 11, an image of repair; and 12, an image of a defect (leak occurrence portion resulting from a foreign matter). FIG. 17 shows an example where the defects occur such as the leakage in the photoelectric conversion element, the leakage between the signal wiring 203 and the TFT drive wiring 201, and the leakage between the bias wiring and the TFT drive wiring. In this case shown in the figure, the six portions in total of leakage in the drain electrode and the source electrode of the TFT, both sides of the cross portion where the TFT drive wiring and the signal wiring cross each other, and both sides of the cross portion where the bias wiring and the TFT drive wiring cross each other, are cut with the laser irradiation for the repair. FIG. 18 shows an example where the defects such as the leakage in the photoelectric conversion element and in the TFT 1 occur. In this case shown in the figure, the three portions in total of leakage in the drain electrode of the TFT and both sides of the cross portion where the TFT drive wiring and the signal wiring cross each other are cut with the laser irradiation for the repair.

In the case where a defect such as a leakage of the photoelectric conversion element, a leakage of the TFT 1, or a leakage between the signal wiring 203 and the TFT drive wiring 201 is repaired, in order to electrically separate the signal wiring 203, the TFT drive wiring 201, and the bias wiring 204 from one another, it is preferable to cut the wirings mainly in the TFT region.

Even if a disconnection is caused on a line of the TFT drive wirings 201, the TFTs can be controlled in the case where the gate driver is located on each of both sides of the pixel portion. Similarly, in the case where redundant wirings or the like for the bias wirings 204 are provided and connections (all line connections) are conducted from both sides of the pixel portion, the photoelectric conversion element can be controlled.

In contrast to this, if the signal wiring 203 is cut, signal processing is adversely affected or processing becomes complicated. Therefore, in this embodiment, an example in which the wirings other than the signal wirings 203 are cut for repair will be described. Note that if amplifier ICs can be arranged on both sides of the signal wirings, even when the disconnection occurs at one portion on a line, the signal can be output. In such cases, the lower electrode of the photo diode above the signal wiring is removed and the signal wiring may be cut as well.

As described above, according to the repair technique using laser light, if the plurality of metallic films are located in the laser irradiation region, these metallic films are short-circuited in melting and evaporating depending on conditions. Therefore, it is preferable to conduct repair in a region in which two or more wirings are not overlapped with one another. If the metallic film (third conductive layer) or the Si film which is thick (second semiconductor layer) is located in a wiring portion to be repaired, a defect such as cut processing precision is reduced or cutting is impossible is caused.

According to this embodiment, in order to conduct stable repair, as shown by a thick line (lower electrode 9 of the photoelectric conversion element) and a broken line (location region of the second semiconductor layer) in FIGS. 17 and 18, the opening is provided above a repair section (region in which the plurality of wirings are not overlapped with one another) of the TFT region.

In FIG. 17, both the lower electrode 9 of the photoelectric conversion element and the second semiconductor layer are formed so as to allow the TFT region to be widely opened. Further, an opening is formed in the intersection between the bias wiring 204 and the TFT drive wiring 201.

Therefore, when a defect such as a leakage in the photoelectric conversion element, a leakage in the TFT, a leakage in a cross portion between the signal wiring 203 and the TFT drive wiring 201, a leakage in a cross portion between the bias wiring 204 and the TFT drive wiring 201, or the like is caused, it is possible to cut the TFT drive wiring 201, the source and drain electrodes, and the bias wiring 204.

The TFT 1 shown in FIG. 18 is a channel etch type. Here, the TFT region is widely opened. Alternatively, only a region in which the signal wiring 203 and the TFT drive wiring 201 are not overlapped with each other may be opened.

Therefore, when a defect such as a leakage in the photoelectric conversion element, a leakage in the TFT, a leakage in a cross portion between the signal wiring 203 and the TFT drive wiring 201, or the like is caused, it is possible to cut the TFT drive wiring 201, and the source and drain electrodes.

According to this embodiment, in an image pickup apparatus which includes at least the TFTs each having the first semiconductor layer and the photoelectric conversion elements each having the second semiconductor layer and the electrodes which are formed above the TFT, the defect portion, typically, the element short circuit portion in the photoelectric conversion element, the TFT short circuit portion, or the like, can be stably processed by laser repair.

Fourth Embodiment

In this embodiment, an example of a direct type radiation image pickup apparatus in which switching elements composed of TFTs and semiconductor conversion elements represented by a-Se layers are combined will be described with reference to FIGS. 19 to 21.

Figure 19:
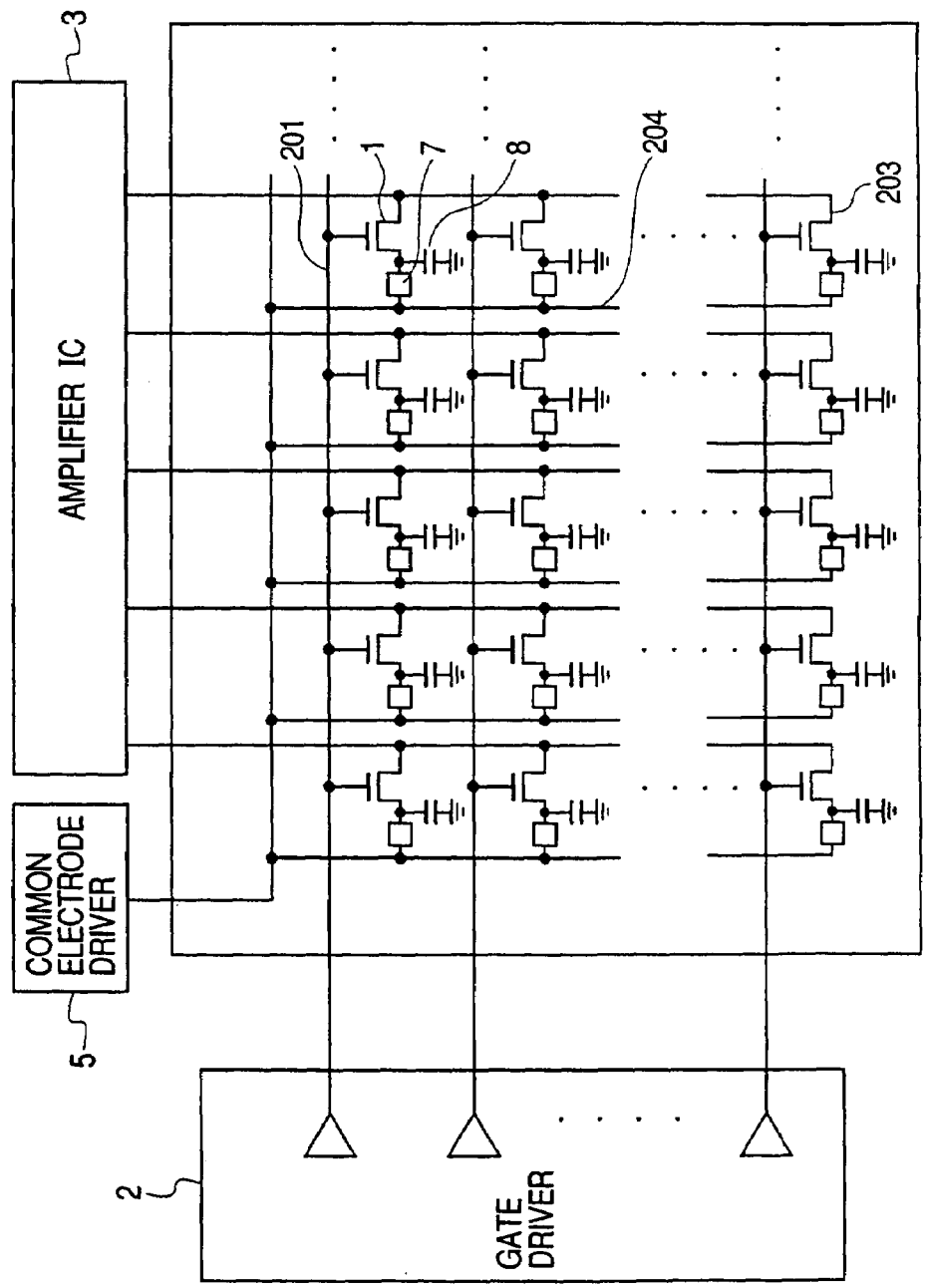
FIG. 19 is a schematic equivalent circuit diagram of a radiation image pickup apparatus according to a fourth embodiment of the present invention.

FIG. 19 is a schematic equivalent circuit diagram of a radiation image pickup apparatus according to this embodiment.

An operation of the radiation image pickup apparatus according to this embodiment will be described with reference to FIG. 19. A radiation incident into an object to be examined transmits while it is attenuated through the object to be examined, and is incident into a semiconductor conversion element 7 (composed of, for example, an a-Se layer). The incident radiation is directly converted into electron-hole pair charges corresponding to the incident radiation energy in the a-Se layer. In the case where a voltage of several kilovolts is applied between both sides of the a-Se layer through the bias wiring 204 connected with the common electrode driver 5, the generated charges are collected by an electric field and then accumulated in an accumulating capacitor 8 which is located on an insulating substrate. The accumulated charges are transferred to the signal line 203 through the TFT 1 and read to the outside by the amplifier IC 3.

Also, the drive wiring 201 common to the TFTs 1 is connected with the gate driver 2 that controls turning on/off of each of the TFTs 1.

Figure 20:
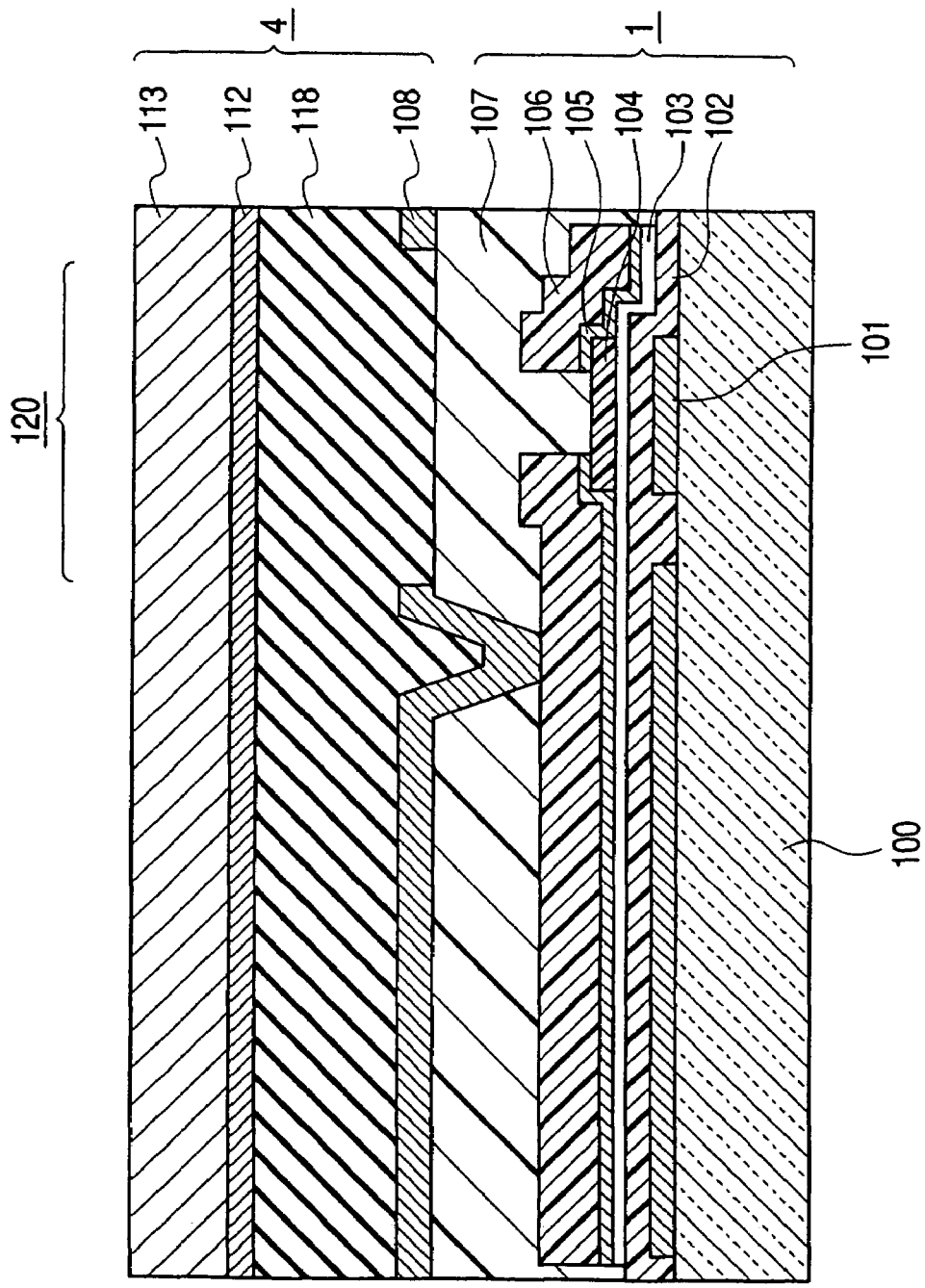
FIG. 20 is a schematic sectional view of the radiation image pickup apparatus according to the fourth embodiment of the present invention.

FIG. 20 is a schematic sectional view of the radiation image pickup apparatus according to this embodiment.

A layer structure of the radiation image pickup apparatus according to this embodiment will be described with reference to FIG. 20.

First, a first conductive layer 101 (for example, AlNd/Mo, 2500 angstroms) is formed on a glass substrate 100 by sputtering, and the TFT drive wiring 201 and a lower electrode of an accumulating capacitor 8 are formed. Next, a first insulating layer 102 (for example, SiN, 3000 angstroms), a first semiconductor layer 103 (for example, a-Si, 500 angstroms), and a second insulating layer (channel protective layer) 104 (for example, SiN, 2000 angstroms) are formed in succession in the stated order on the glass substrate 100 and the TFT drive wiring by a CVD method. After that, using a resist image (not shown) formed by rear exposure and mask exposure, the second insulating layer (channel protective layer) 104 is etched so as to be left only above the TFT drive wiring.

Here, in order to improve the transfer capability of the TFT by reducing a parasitic capacitance produced due to overlap of a signal wiring side electrode with the TFT drive wiring in a TFT portion, an etching stopper type TFT is formed by using the rear exposure.

Subsequently, a first ohmic contact layer 105 (for example, $n^+$-type a-Si, 200 angstroms) is formed by a CVD method and a second conductive layer 106 (for example, AlNd/Mo, 4000 angstroms) is formed on the ohmic contact layer by sputtering. Next, the second conductive layer 106 is patterned by wet etching to form an upper electrode of the accumulating capacitor and the source and drain electrodes and the signal wiring of the TFT. After that, the source-drain separation of the first ohmic contact layer 105 and the element separation of the first semiconductor layer 103 are conducted by dry etching.

Next, a third insulating layer 107 (for example, organic film of benzocyclobutene (BCB) or polyimide (PI)) is deposited as a planarizing film and a contact hole is formed on the upper electrode of the accumulating capacitor. Then, a third conductive layer 108 (for example, AlNd/Mo, 2000 angstroms) is formed by sputtering to be connected with the upper electrode of the accumulating capacitor and to compose the lower electrode of the semiconductor conversion element.

In this embodiment, the lower electrode of the semiconductor conversion element is arranged in at least part of the region above the TFT drive wiring (including the gate electrode) and at least part of the region above the source and drain electrodes of the TFT outside a region in which two of the TFT drive wiring (with the protruded portion serving as the gate electrode), the source and drain electrodes of the TFT, and the signal wiring overlap with each other. Here, the lower electrode of the photoelectric conversion element in the overlap portion (cross portion) with the signal wiring, the TFT constituting portion, the TFT drive wiring, and the signal wiring, and its vicinities is removed. In its vicinities, at least the drive wiring and the source and drain electrodes of the TFT extend. The drive wiring and the source and drain electrodes of the TFT can be cut with the laser irradiation.

Further, the a-Se layer is formed as a direct conversion material film 118 on the third insulating layer 107 or the third conductive layer 108. Then, the fourth conductive layer 112 (for example, Mo/Al/Mo, 4000 angstroms) is formed by sputtering to form the bias wiring 204 having a shape in which only the TFT region is opened. After that, the protective layer 113 (for example, SiN and an organic film) is formed on the entire surface, electrical testing is conducted, and the laser repair is conducted on a defect portion if necessary.

Next, a repair method will be described. Description of the repair method will be made with reference to the structure in which the metallic film which is located above the TFT region is removed as shown in the schematic sectional view of FIG. 20.

Figure 21:
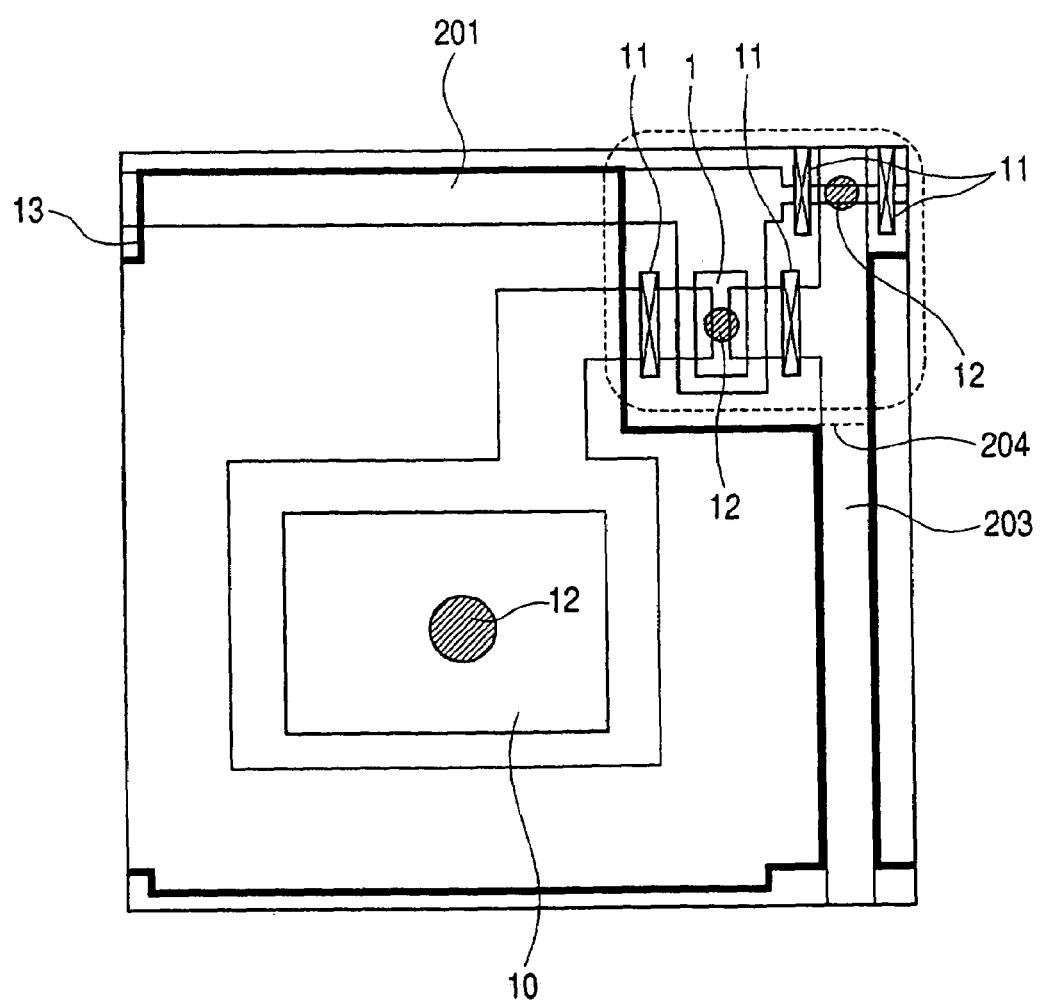
FIG. 21 is a schematic plan view of a pixel region of the radiation image pickup apparatus according to the fourth embodiment of the present invention.

In FIG. 21, reference numeral 1 denotes the TFT; 13, a lower electrode of the direct type semiconductor conversion element; 10, a contact hole; 203, the signal wiring; 201, the drive wiring of the TFT; 11, an image of repair; and 12, an image of a defect (leak occurrence portion resulting from a foreign matter).

In the case where a defect such as a leakage of the direct type semiconductor conversion element 7, a leakage of the TFT 1, a leakage between the signal wiring 203 and the TFT drive wiring 201, or a leakage of the accumulating capacitor 8 is repaired, in order to electrically separate the signal wiring 203 and the TFT drive wiring 201 from each another, it is preferable to cut the wirings mainly in the TFT region.

Even if a disconnection is caused on a line of the TFT drive wirings 201, the TFTs can be controlled by providing the gate driver on each of both sides of the pixel portion.

In contrast to this, if the signal wiring 203 is cut, signal processing is adversely affected or processing becomes complicated. Therefore, in this embodiment, an example in which the wirings other than the signal wirings 203 are cut for repair will be described.

As described above, according to the repair technique using laser light, if the plurality of metallic films are located in the laser irradiation region, these metallic films are short-circuited in melting and evaporating depending on conditions. Therefore, it is preferable to conduct repair in a region in which two or more wirings are not overlapped with one another. If the metallic film (third conductive layer) is located in a wiring portion to be repaired, a defect such as cut processing precision is reduced or cutting is impossible is caused.

According to this embodiment, in order to conduct stable repair, as shown by a thick line (lower electrode 13 of the direct type semiconductor conversion element) in FIG. 13, the opening is provided above a repair section (region in which the plurality of wirings are not overlapped with one another) of the TFT region.

In FIG. 21, a lower electrode 13 of the semiconductor conversion element is formed so as to open in the TFT region.

With this structure, when a leakage in the semiconductor conversion element 7, a leakage in the TFT 1, a leakage in the accumulating capacitor, or a leakage in a cross portion between the signal wiring 203 and the TFT drive wiring 201 is caused, the TFT drive wiring 201 and the source and drain electrodes are cut.

According to this embodiment, in a radiation detecting device which includes the TFTs each having the first semiconductor layer and the semiconductor conversion elements each having the electrodes which are formed above the TFT, the defect portion, typically, the element short circuit portion in the photoelectric conversion element, the TFT short circuit portion, or the like, can be stably processed by laser repair.

Fifth Embodiment

In this embodiment, an example of an image pickup apparatus in which switching elements composed of TFTs, MIS type photoelectric conversion elements, and reading TFTs that read signals corresponding to the amount of charges generated in the MIS type photoelectric conversion elements are formed will be described with reference to FIG. 22.

Figure 22:
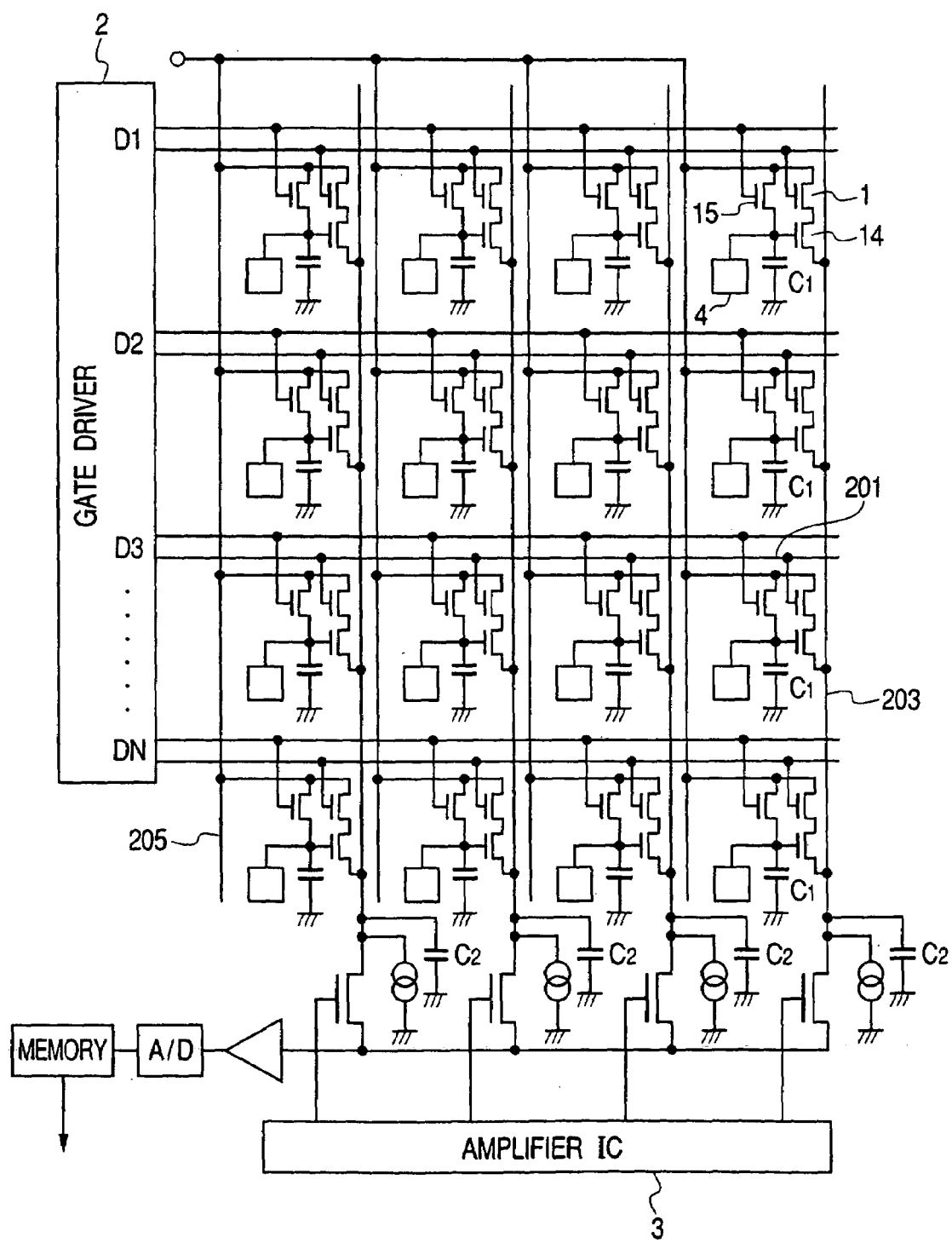
FIG. 22 is a schematic equivalent circuit diagram of an image pickup apparatus according to a fifth embodiment of the present invention.

FIG. 22 is a schematic equivalent circuit diagram of an image pickup apparatus according to this embodiment. In FIG. 22, the drive wirings (for switching in this embodiment) 201 common to the TFTs serving as the switching elements are connected with the gate driver 2 that controls turning on/off of the TFT 1. The source or drain electrode of the TFT 1 is connected with one of the common signal wirings 203 through the reading TFT 14. The signal wirings 203 are connected with the amplifier IC 3. One electrode of the photoelectric conversion element 4 is connected with a common electrode driver which is not shown and the other electrode thereof is connected with the control electrode of the reading TFT 14. One of the source and the drain of each of the reset TFTs 15 is connected with the control electrode of the reading TFT 14 and the other thereof is connected with a reset wiring.

A radiation incident into the object to be examined transmits through the object to be examined while being attenuated, and is converted into visible light by the phosphor layer. The visible light is incident into the photoelectric conversion element 4 and converted into a charge. The charge causes a variation in potential corresponding to the amount of irradiation light with respect to the control electrode of the reading TFT 14. The amount of electric signal flowing into the reading TFT 14 changes with the variation in potential, so that a signal corresponding to the charge can be read through the signal wiring 203. The TFT 1 serving as the switching element is used to switch between application and non-application of a voltage between the source and the drain of the reading TFT 14. The signal is transferred to the signal wiring 203 through the TFT 1 in accordance with a gate drive pulse and read to the outside by the amplifier IC 3. After the signal reading, the reset TFT 15 is driven to apply a voltage to the electrodes of the photoelectric conversion element 4 connected with the reset TFT 15 through a reset wiring 205, so that the charge accumulated in the photoelectric conversion element 4 can be removed.

In such a source follower type image pickup apparatus, it is necessary to arrange a plurality of transistors (for example, the reading TFTs and the reset TFTs in this embodiment), in addition to the TFTs each including the first semiconductor layer and the photoelectric conversion elements each including the second semiconductor layer. In addition, it is possible to arrange capacitors in the circuit. In such a case, if each of the capacitors is formed from the planarizing film and the four layers of the metallic film as described above, design variations can be increased. For example, it is possible to use the arrangement in which the switching TFTs, the reset TFTs, and the capacitors are formed in the lower layer and the photoelectric conversion elements and the reading TFT are formed in the upper layer.

However, simultaneously, when a wiring is short-circuited particularly due to a defect caused in the TFT formed in the lower layer, the laser repair using, for example, the photoelectric conversion element and the reading TFT which are arranged in the upper layer cannot be conducted. Therefore, the metallic films and the second semiconductor layer which compose, for example, the photoelectric conversion element and the reading TFT are removed particularly in the region above the TFT region in the lower layer, thereby stabilizing processing using the laser repair.

According to this embodiment, in the radiation detecting device which includes the TFTs each having the first semiconductor layer (for example, switching TFTs and reset TFTs) and the photoelectric conversion elements each having the second semiconductor layer and the electrodes which are formed above the TFT, the defect portion, typically, the element short circuit portion in the photoelectric conversion element, the TFT short circuit portion, or the like, is stably processed by laser repair.

As described above, according to the present invention, there can be provided an image pickup apparatus and a radiation image pickup apparatus, each of which includes the switching elements each having the first semiconductor layer, the semiconductor conversion elements each including the second semiconductor layer formed above the switching element, the drive wirings connected with the switching elements, and the signal wirings connected with the semiconductor conversion elements. The respective devices are capable of stably processing the defect portion by laser repair even if a defect such as a leakage is caused, whereby the manufacturing yield is improved.

Figure 23A:
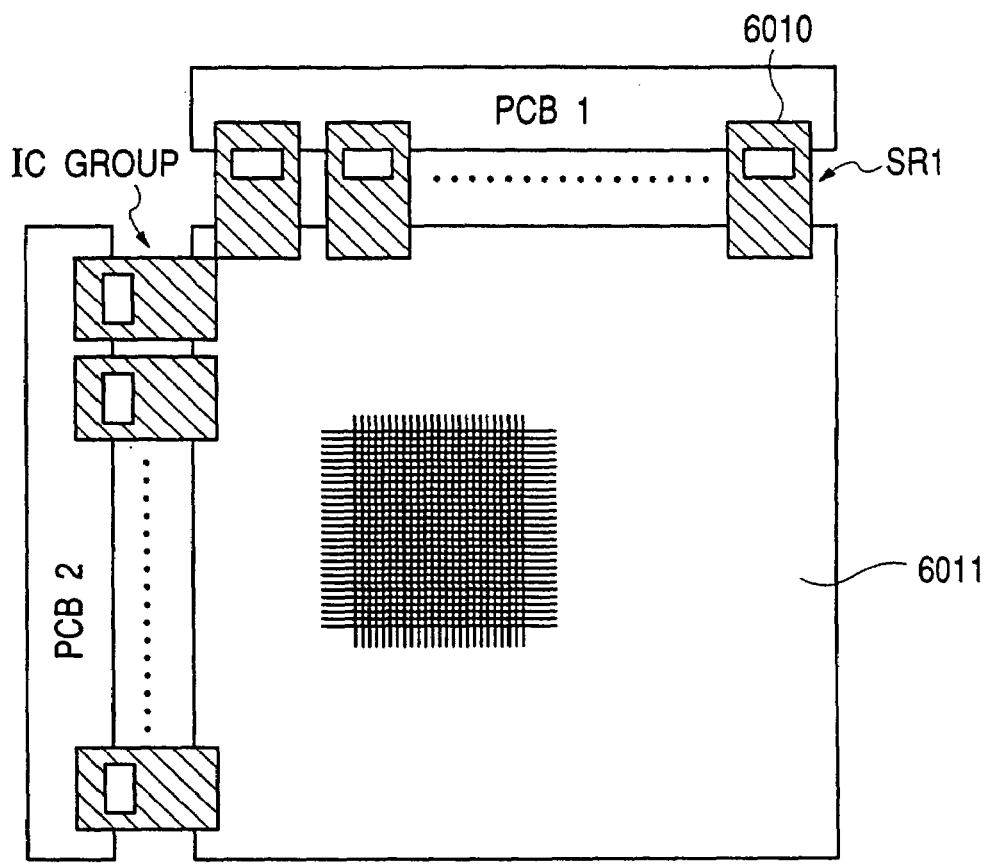
FIGS. 23A and 23B are a schematic structural view and a schematic sectional view of a radiation (an X-ray) image pickup apparatus in an implementation mode according to the present invention, respectively.
Figure 23B:
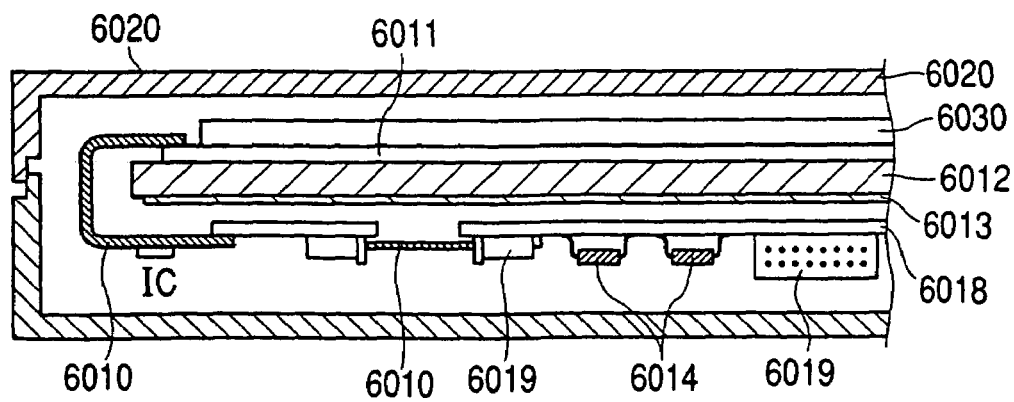

FIGS. 23A and 23B are the schematic structural view and the schematic sectional view of the radiation (X-ray) image pickup apparatus in the implementation mode according to the present invention, respectively.

In the figures, the plural photoelectric conversion elements and TFTs are formed within a sensor substrate 6011, which is connected with a flexible circuit board 6010 where a shift register SR1 and a detecting integrated circuit IC are mounted. The opposite side of the flexible circuit board 6010 is connected to circuit boards PCB1 and PCB2. The plural sensor substrates 6011 are bonded onto a base 6012 to constitute a large-sized photoelectric conversion apparatus. A lead plate 6013 is mounted on a lower portion of the base 6012 constituting the photoelectric conversion apparatus so as to protect a memory 6014 in a processing circuit 6018 from the X-ray. On the sensor substrate 6011, a scintillator (phosphor layer) 6030 for converting the X-ray to the visible light is formed; for example, CsI is deposited. As shown in FIG. 23B, the whole is accommodated into a case 6020 made of carbon fiber.

FIG. 24 shows an application of a radiation image pickup apparatus according to the present invention to an X-ray diagnostic system.

In the figure, an X-ray 6060 generated in an X-ray tube 6050 is transmitted through a chest 6062 of a patient or subject 6061 and made incident on a photoelectric conversion apparatus 6040 on which the scintillator is mounted (photoelectric conversion apparatus on which the scintillator is mounted constitutes the radiation image pickup apparatus). The incident X-ray includes information on the inside of the body of the patient 6061. The scintillator emits light in response to the incidence of the X-ray. The radiation undergoes the photoelectric conversion into the electrical signal as the electric information. This information is converted into a digital image and subjected to the image processing with an image processor 6070 serving as a signal processing unit. The processed image can be observed on a display 6080 as a control unit in a control room.

Also, the information can be transferred to a remote location with a transmission unit including a telephone line 6090 etc. and can be displayed on a display 6081 as a display unit in another location such as a doctor room or recorded on a recording unit such as an optical disk. Thus, a doctor can make a diagnosis at the remote location as well. Also, the information can be recorded on a film 6110 as the recording medium by a film processor 6100 as the recording unit.

As many apparently widely different embodiments of the present invention can be made without departing from the spirit and scope thereof, it is to be understood that the invention is not limited to the specific embodiments thereof except as defined in the claims.

What is claimed is:

1. An image pickup apparatus, comprising:
    a substrate;
    a plurality of pixels arranged along rows and columns on the substrate, wherein each pixel includes a semiconductor conversion element converting an incident electromagnetic wave into an electric signal and a switching element connected with the semiconductor conversion element, the switching element is disposed on the substrate, and the semiconductor conversion element is disposed above the switching element;
    a drive wiring connected commonly with a plurality of the switching elements arranged along a row; and
    a signal wiring connected commonly with a plurality of the switching elements arranged along a column,
    wherein the semiconductor conversion element has an electrode formed outside a region in which two of the drive wiring, an electrode of the switching element, and the signal wiring overlap each other, exclusive of a region above at least a part of the drive wiring and of a region above at least a part of the electrode of the switching element,
    and wherein at least the part of the drive wiring or at least the part of the electrode of the switching element is electrically discontinued.

2. An image pickup apparatus according to claim 1, wherein the electrode of the semiconductor conversion element is formed outside a region above a part of the signal wiring.

3. An image pickup apparatus according to claim 1, wherein the electrode of the semiconductor conversion element is formed outside a region above the switching element.

4. An image pickup apparatus according to claim 1, wherein the switching element includes a first semiconductor layer, the semiconductor conversion element includes a second semiconductor layer, and the second semiconductor layer is disposed above the first semiconductor layer.

5. An image pickup apparatus according to claim 4, wherein the second semiconductor layer is disposed on a region exclusive of a region above the switching element.

6. An image pickup apparatus according to claim 1, further comprising:
an insulating layer disposed between the switching element and the semiconductor conversion element.

7. An image pickup apparatus, comprising:
a substrate;
a plurality of pixels arranged along rows and columns on the substrate, wherein each pixel includes a semiconductor conversion element converting an incident electromagnetic wave into an electric signal and a switching element connected with the semiconductor conversion element, the switching element is disposed on the substrate, and the semiconductor conversion element is disposed above the switching element;
a drive wiring connected commonly with a plurality of the switching elements arranged along a row; and
a signal wiring connected commonly with a plurality of the switching elements arranged along a column,
wherein the semiconductor conversion element has an aperture formed outside a region in which two of the drive wiring, an electrode of the switching element, and the signal wiring overlap each other, and within a region above at least a part of the drive wiring and above at least a part of the electrode of the switching element,
and wherein at least the part of the drive wiring or at least the part of the electrode of the switching element is electrically discontinued.

8. An image pickup apparatus according to claim 7, wherein the aperture is formed in a region above a part of the signal wiring.

9. An image pickup apparatus according to claim 7, wherein the aperture is formed in a region above the switching element.

10. An image pickup apparatus according to claim 7, wherein the switching element includes a first semiconductor layer, the semiconductor conversion element includes a second semiconductor layer, and the second semiconductor layer is disposed above the first semiconductor layer.

11. An image pickup apparatus according to claim 10, wherein the second semiconductor layer is disposed on a region exclusive of a region above the switching element.

12. An image pickup apparatus according to claim 7, further comprising:
an insulating layer disposed between the switching element and the semiconductor conversion element.

13. An image pickup apparatus, comprising:
a substrate;
a plurality of pixels arranged along rows and columns on the substrate, wherein each pixel includes a semiconductor conversion element converting an incident electromagnetic wave into an electric signal and a switching element connected with the semiconductor conversion element, the switching element is disposed on the substrate, and the semiconductor conversion element is disposed above the switching element;
a drive wiring connected commonly with a plurality of the switching elements arranged along a row; and
a signal wiring connected commonly with a plurality of the switching elements arranged along a column,
wherein the semiconductor conversion element has an electrode formed outside a region in which two of the drive wiring, an electrode of the switching element, and the signal wiring overlap each other, exclusive of a region above at least a part of the drive wiring, of a region above at least a part of the electrode of the switching element, and of a region above the switching element.

14. An image pickup apparatus, comprising:
a substrate;
a plurality of pixels arranged along rows and columns on the substrate, wherein each pixel includes a semiconductor conversion element converting an incident electromagnetic wave into an electric signal and a switching element connected with the semiconductor conversion element, the switching element is disposed on the substrate, and the semiconductor conversion element is disposed above the switching element;
a drive wiring connected commonly with a plurality of the switching elements arranged along a row; and
a signal wiring connected commonly with a plurality of the switching elements arranged along a column,
wherein the semiconductor conversion element has an aperture formed outside a region in which two of the drive wiring, an electrode of the switching element, and the signal wiring overlap each other, and within a region above at least a part of the drive wiring, above at least a part of the electrode of the switching element, and above the switching element.

* * * * *